United States Patent
Todorokihara

(10) Patent No.: US 12,000,858 B2
(45) Date of Patent: Jun. 4, 2024

(54) VIBRATION RECTIFICATION ERROR CORRECTION DEVICE, SENSOR MODULE, AND VIBRATION RECTIFICATION ERROR CORRECTION METHOD

(71) Applicant: Seiko Epson Corporation, Tokyo (JP)

(72) Inventor: Masayoshi Todorokihara, Suwa (JP)

(73) Assignee: SEIKO EPSON CORPORATION (JP)

( * ) Notice: Subject to any disclaimer, the term of this patent is extended or adjusted under 35 U.S.C. 154(b) by 338 days.

(21) Appl. No.: 17/562,052

(22) Filed: Dec. 27, 2021

(65) Prior Publication Data
US 2022/0206038 A1    Jun. 30, 2022

(30) Foreign Application Priority Data
Dec. 28, 2020 (JP) ................. 2020-219504

(51) Int. Cl.
| | |
|---|---|
| *G01P 15/097* | (2006.01) |
| *G01C 19/5783* | (2012.01) |
| *G01D 1/16* | (2006.01) |
| *G01P 1/02* | (2006.01) |
| *H03M 3/00* | (2006.01) |

(52) U.S. Cl.
CPC ........ *G01P 15/097* (2013.01); *G01C 19/5783* (2013.01); *G01P 1/023* (2013.01); *H03M 3/378* (2013.01); *G01D 1/16* (2013.01); *H03M 3/30* (2013.01)

(58) Field of Classification Search
CPC ........ G01P 15/09; G01P 15/097; G01P 1/023; G01C 19/5776; G01C 19/5783; H03M 3/04; H03M 3/30; H03M 3/378; G01D 1/16
USPC .......................................... 702/85
See application file for complete search history.

(56) References Cited

U.S. PATENT DOCUMENTS

2019/0324052 A1    10/2019    Sato et al.
2019/0331491 A1*   10/2019    Todorokihara .......... G01P 15/10

FOREIGN PATENT DOCUMENTS

JP    2019-190897 A    10/2019

* cited by examiner

*Primary Examiner* — John H Le
(74) *Attorney, Agent, or Firm* — Harness, Dickey & Pierce, P.L.C.

(57) ABSTRACT

A vibration rectification error correction device includes a first filter that operates in synchronization with the measured signal, and a second filter that operates in synchronization with the reference signal, in which the first filter generates a third signal based on a first signal having a first group delay amount and a second signal having a second group delay amount, the second filter receives a signal based on the third signal and outputs a fourth signal, and a first vibration rectification error and a second vibration rectification error have different polarities.

11 Claims, 16 Drawing Sheets

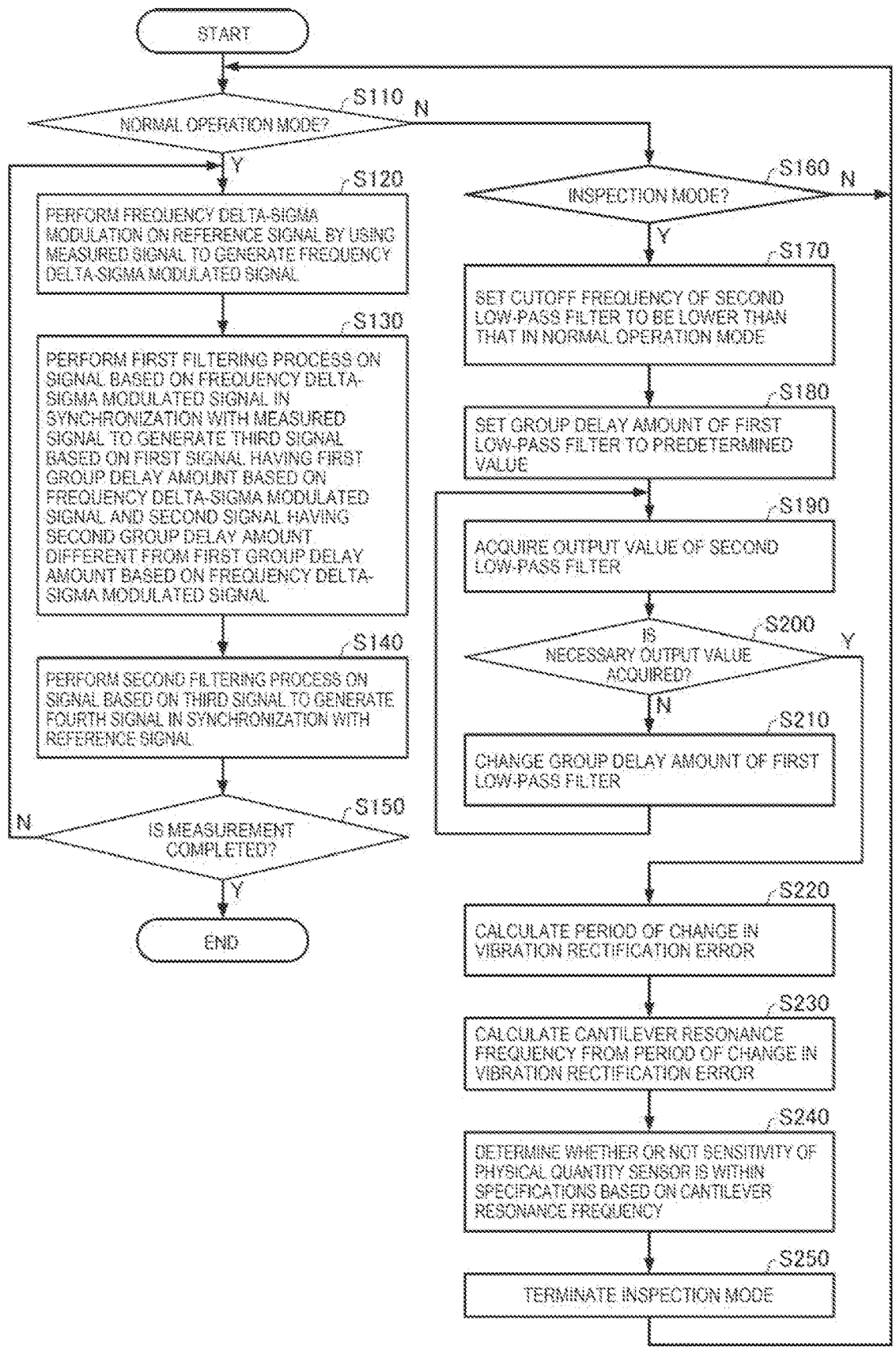

VIBRATION RECTIFICATION ERROR CORRECTION DEVICE, SENSOR MODULE, AND VIBRATION RECTIFICATION ERROR CORRECTION METHOD

The present application is based on, and claims priority from JP Application Serial Number 2020-219504, filed Dec. 28, 2020, the disclosure of which is hereby incorporated by reference herein in its entirety.

BACKGROUND

1. Technical Field

The present disclosure relates to a vibration rectification error correction device, a sensor module, and a vibration rectification error correction method.

2. Related Art

JP-A-2019-190897 describes a sensor module having a configuration in which a first low-pass filter is operated in synchronization with an output signal of a physical quantity sensor, and a second low-pass filter in a subsequent stage performs resampling in synchronization with a reference clock. According to this sensor module, non-linearity occurs in the input and the output of the entire low-pass filter, and the vibration rectification error caused by this non-linearity is adjusted so as to be in the opposite phase to the vibration rectification error caused by the cantilever resonance of the physical quantity sensor. Therefore, it is possible to cancel each other's vibration rectification errors and reduce the vibration rectification errors that appear in the final output.

In the sensor module described in JP-A-2019-190897, the vibration rectification error due to the non-linearity of the input and the output of the entire low-pass filter is corrected by adjusting the group delay amount of the first low-pass filter, but the adjustment resolution of the group delay amount of the first low-pass filter is determined by the period of the output signal of a physical quantity sensor, there is also a limit to the correction resolution of vibration rectification error.

SUMMARY

A vibration rectification error correction device according to an aspect of the present disclosure includes a reference signal generation circuit that outputs a reference signal, a frequency delta-sigma modulation circuit that performs frequency delta-sigma modulation on the reference signal by using a measured signal to generate a frequency delta-sigma modulated signal, a first filter that operates in synchronization with the measured signal, and a second filter that operates in synchronization with the reference signal, in which the first filter generates a third signal based on a first signal having a first group delay amount based on the frequency delta-sigma modulated signal, and a second signal having a second group delay amount different from the first group delay amount based on the frequency delta-sigma modulated signal, the second filter receives a signal based on the third signal and outputs a fourth signal, and a first vibration rectification error included in a fifth signal output from the second filter when the first signal is input to the second filter and a second vibration rectification error included in a sixth signal output from the second filter when the second signal is input to the second filter have different polarities.

A sensor module according to another aspect of the present disclosure includes the vibration rectification error correction device according to one aspect, a physical quantity sensor, in which the measured signal is a signal based on an output signal of the physical quantity sensor.

A vibration rectification error correction method according to still another aspect of the present disclosure includes performing frequency delta-sigma modulation on a reference signal by using a measured signal to generate a frequency delta-sigma modulated signal, performing a first filtering process on a signal based on the frequency delta-sigma modulated signal in synchronization with the measured signal to generate a third signal based on a first signal having a first group delay amount based on the frequency delta-sigma modulated signal, and a second signal having a second group delay amount different from the first group delay amount based on the frequency delta-sigma modulated signal, and performing a second filtering process on a signal based on the third signal in synchronization with the reference signal to generate a fourth signal, in which a first vibration rectification error included in a fifth signal generated when the second filtering process is performed on the first signal and a second vibration rectification error included in a sixth signal generated when the second filtering process is performed on the second signal have different polarities.

BRIEF DESCRIPTION OF THE DRAWINGS

FIG. 27 is a flowchart illustrating an example of a procedure of a vibration rectification error correction method according to a third embodiment.

DESCRIPTION OF EXEMPLARY EMBODIMENTS

Hereinafter, an exemplary embodiment of the present disclosure will be described in detail with reference to drawings. The embodiments described below do not unduly limit the contents of the present disclosure described in the aspects. In addition, not all of the configurations described below are essential constituent requirements of the present disclosure.

1. First Embodiment 1-1. Structure of Sensor Module

First, an example of a structure of a sensor module according to the present embodiment will be described.

Figure 1:
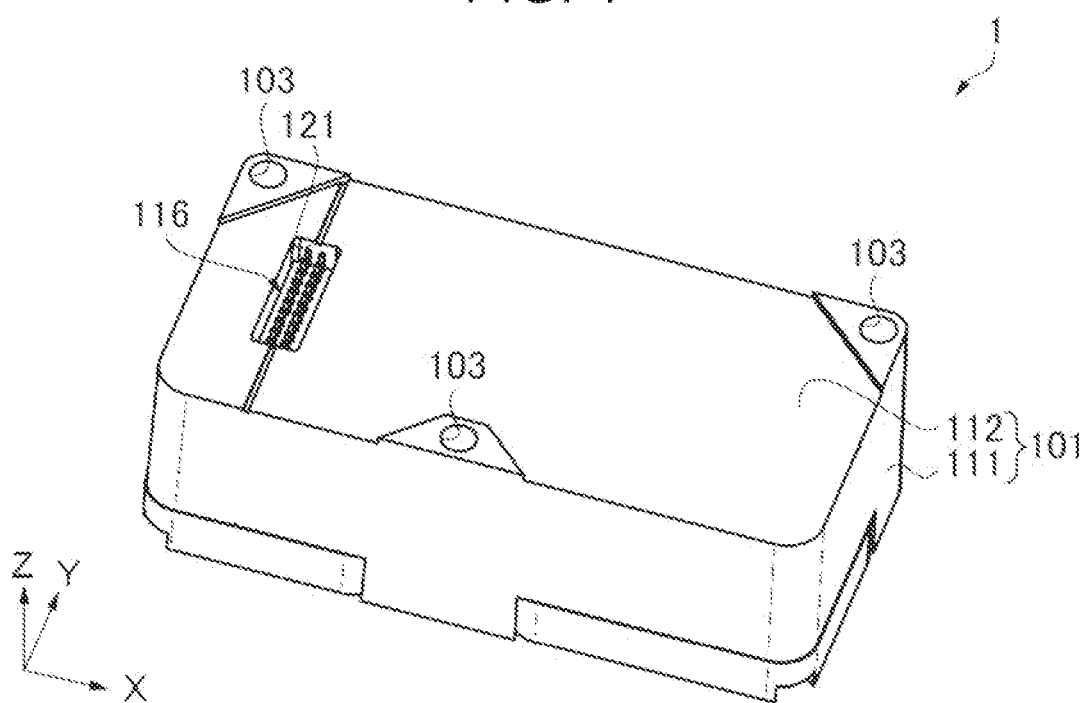
FIG. 1 is a perspective view of a sensor module.

FIG. 1 is a perspective view of a sensor module 1 when viewed from a mounting target surface side to which the sensor module 1 is fixed. In the following description, a direction along a long side of the sensor module 1 that forms a rectangle in a plan view will be described as an X-axis direction, a direction orthogonal to the X-axis direction in a plan view will be described as a Y-axis direction, and a thickness direction of the sensor module 1 will be described as a Z-axis direction.

The sensor module 1 is a rectangular parallelepiped having a rectangular planar shape, and has a long side along the X-axis direction and a short side along the Y-axis direction orthogonal to the X-axis direction. Screw holes 103 are formed at two locations near each end portion of one long side and at one location in a central portion of the other long side. Each of the screw holes 103 at three locations is used in a state of being fixed to a mounting target surface of a mounting target body of a structure such as a building, a bulletin board, or various devices via a fixing screw.

As illustrated in FIG. 1, an opening portion 121 is provided at a front surface of the sensor module 1 viewed from the mounting target surface side. A plug-type connector 116 is disposed inside the opening portion 121. The connector 116 has a plurality of pins arranged in two rows, and in each row, the plurality of pins are arranged in the Y-axis direction. A socket-type connector (not illustrated) is coupled to the connector 116 from the mounting target body, and an electric signal such as a drive voltage of the sensor module 1 and detection data is transmitted and received.

Figure 2:
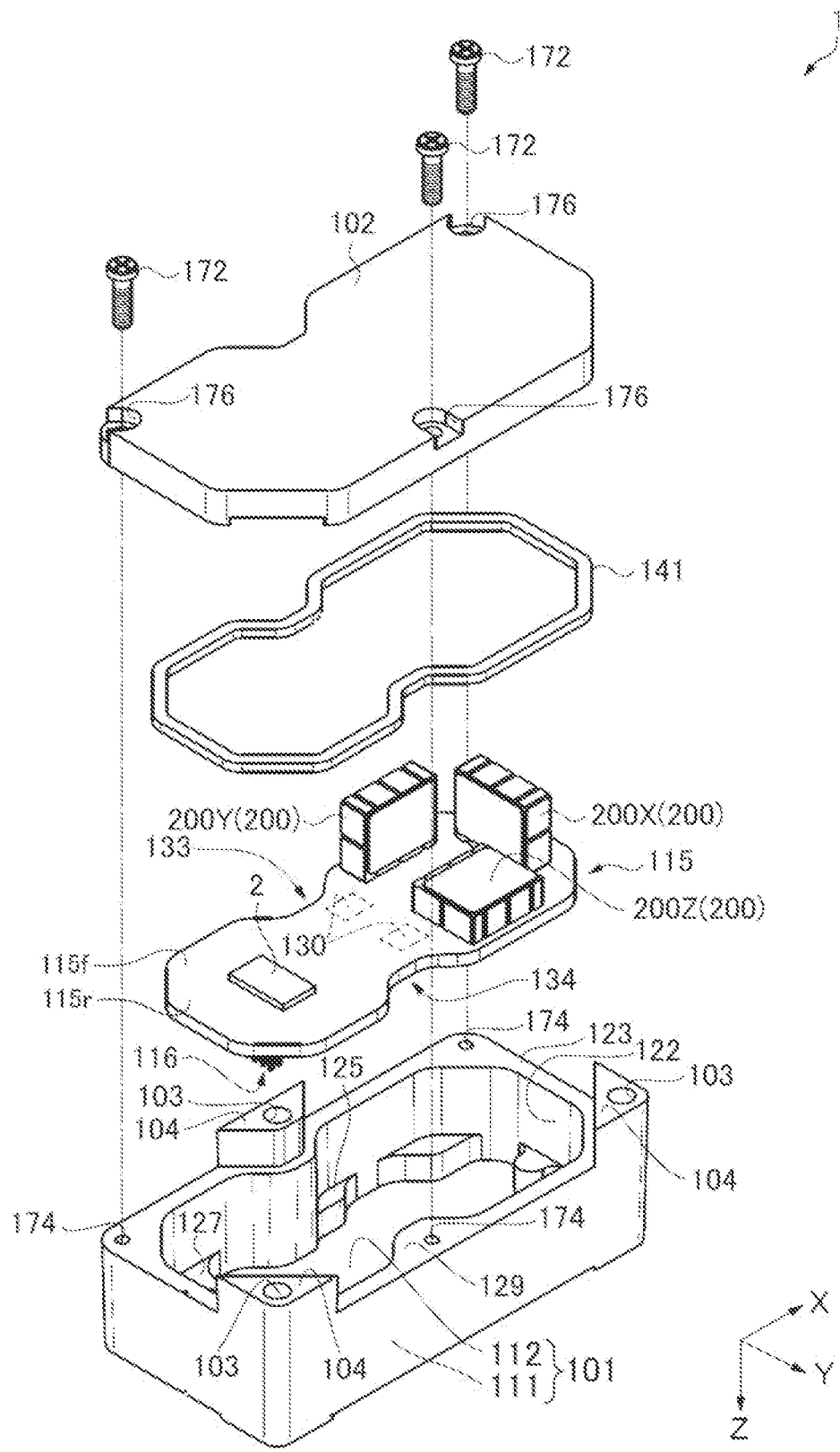
FIG. 2 is an exploded perspective view of the sensor module.

FIG. 2 is an exploded perspective view of the sensor module 1. As illustrated in FIG. 2, the sensor module 1 includes a container 101, a lid 102, a sealing member 141, a circuit substrate 115, and the like. More specifically, in the sensor module 1, the circuit substrate 115 is attached to the inside of the container 101 with a fixing member 130 interposed, and an opening of the container 101 is covered with the lid 102 via the sealing member 141 having buffering properties.

For example, the container 101 is an accommodation container for the circuit substrate 115 made of aluminum and formed into a box shape having an internal space. Similar to an overall shape of the sensor module 1 described above, an outer shape of the container 101 is a rectangular parallelepiped having a substantially rectangular planar shape, and fixed protrusions 104 are provided at two locations near both end portions of one long side and at one location in a central portion of the other long side. The screw hole 103 is formed in each of the fixed protrusions 104.

The container 101 is a box shape whose outer shape is a rectangular parallelepiped and opened on one side. The inside of the container 101 is an internal space surrounded by a bottom wall 112 and a side wall 111. In other words, the container 101 has a box shape in which one surface facing the bottom wall 112 is an opening surface 123. The container 101 is disposed so that an outer edge of the circuit substrate 115 is disposed along an inner surface 122 of the side wall 111, and the lid 102 is fixed thereto so as to cover the opening. On the opening surface 123, the fixed protrusions 104 are erected at two locations near both end portions of one long side of the container 101 and at one location in the central portion of the other long side. An upper surface of the fixed protrusion 104, that is, a surface exposed in the −Z direction protrudes from the upper surface of the container 101.

In addition, the internal space of the container 101 is provided with a protrusion 129 that protrudes from the side wall 111 toward the internal space from the bottom wall 112 to the opening surface 123 at the central portion of one long side facing the fixed protrusion 104 provided in the central portion of the other long side. A female screw 174 is provided on an upper surface of the protrusion 129. The lid 102 is fixed to the container 101 via the sealing member 141 with a screw 172 and the female screw 174 inserted through a through-hole 176. The protrusion 129 and the fixed protrusion 104 are provided at positions facing constricted portions 133 and 134 of the circuit substrate 115 described later.

In the internal space of the container 101, a first pedestal 127 and a second pedestal 125 are provided that protrude from the bottom wall 112 toward the opening surface 123 in a stepped manner. The first pedestal 127 is provided at a position facing a disposition region of the plug-type connector 116 attached to the circuit substrate 115. The first pedestal 127 is provided with the opening portion 121 illustrated in FIG. 1, and a plug-type connector 116 is inserted into the opening portion 121. The first pedestal 127 functions as a pedestal for fixing the circuit substrate 115 to the container 101.

The second pedestal 125 is located on a side opposite to the first pedestal 127 with respect to the fixed protrusion 104 and the protrusion 129 located in the central portion of the long side, and is provided in the vicinity of the fixed protrusion 104 and the protrusion 129. The second pedestal 125 functions as a pedestal for fixing the circuit substrate 115 to the container 101 on the side opposite to the first pedestal 127 with respect to the fixed protrusion 104 and the protrusion 129.

The outer shape of the container 101 is described as a box-shaped rectangular parallelepiped having the substantially rectangular planar shape with no lid, and is not limited thereto. The planar shape of the outer shape of the container 101 may be a square, a hexagon, an octagon, or the like. In addition, in the planar shape of the outer shape of the container 101, the corners of the polygonal apex portion may be chamfered, and furthermore, any one of the sides may be a planar shape made of a curve. In addition, the planar shape inside the container 101 is not limited to the shape described above, and may be another shape. Furthermore, the planar shape of the outer shape and the inside of the container 101 may be similar or may not be similar to each other.

The circuit substrate 115 is a multilayer substrate in which a plurality of through-holes and the like are formed. For example, a glass epoxy substrate, a composite substrate, a ceramic substrate, or the like is used.

The circuit substrate 115 includes a second surface 115r on the bottom wall 112 side, and a first surface 115f that has a front-rear relationship with the second surface 115r. On the first surface 115f of the circuit substrate 115, a vibration rectification error correction device 2, three physical quantity sensors 200, other electronic components (not illustrated), and the like are mounted. In addition, the connector 116 is mounted on the second surface 115r of the circuit substrate 115. Although illustration and description thereof are omitted, the circuit substrate 115 may be provided with other wirings, terminal electrodes, and the like.

The circuit substrate 115 is provided with the constricted portions 133 and 134 in which the outer edge of the circuit substrate 115 is constricted in the central portion in the X-axis direction along the long side of the container 101 in a plan view. The constricted portions 133 and 134 are provided on both sides in the Y-axis direction of the circuit substrate 115 in a plan view, and are constricted from the outer edge of the circuit substrate 115 toward the center. In addition, the constricted portions 133 and 134 are provided to face the protrusion 129 and the fixed protrusion 104 of the container 101.

The circuit substrate 115 is inserted into the internal space of the container 101 with the second surface 115r facing the first pedestal 127 and the second pedestal 125. The circuit substrate 115 is supported by the container 101 by the first pedestal 127 and the second pedestal 125.

Each of the three physical quantity sensors 200 is a frequency change type sensor in which the frequency of the output signal changes according to an applied physical quantity. Of the three physical quantity sensors 200, a physical quantity sensor 200X detects a physical quantity in the X-axis direction, a physical quantity sensor 200Y detects a physical quantity in the Y-axis direction, and a physical quantity sensor 200Z detects a physical quantity in the Z-axis direction. Specifically, the physical quantity sensor 200X is erected so that the front and rear surfaces of a package face in the X-axis direction and the side surface faces the first surface 115f of the circuit substrate 115. The physical quantity sensor 200X outputs a signal corresponding to the detected physical quantity in the X-axis direction. The physical quantity sensor 200Y is erected so that the front and rear surfaces of a package face the Y-axis direction and the side surface faces the first surface 115f of the circuit substrate 115. The physical quantity sensor 200Y outputs a signal corresponding to the detected physical quantity in the Y-axis direction. The physical quantity sensor 200Z is provided so that the front and rear surfaces of a package face the Z-axis direction, that is, the front and rear surfaces of the package face the first surface 115f of the circuit substrate 115. The physical quantity sensor 200Z outputs a signal corresponding to the detected physical quantity in the Z-axis direction.

The vibration rectification error correction device 2 is electrically coupled to the physical quantity sensor 200X, 200Y, and 200Z via wiring and electronic components (not illustrated). Further, the vibration rectification error correction device 2 generates physical quantity data in which a vibration rectification error is reduced based on the output signals of the physical quantity sensor 200X, 200Y, and 200Z.

1-2. Structure of Physical Quantity Sensor

Next, an example of a structure of the physical quantity sensor 200 will be described by taking the case where the physical quantity sensor 200 is an acceleration sensor as an example. The three physical quantity sensors 200 illustrated in FIG. 2, that is, the physical quantity sensors 200X, 200Y, and 200Z may have the same structure to one another.

Figure 3:
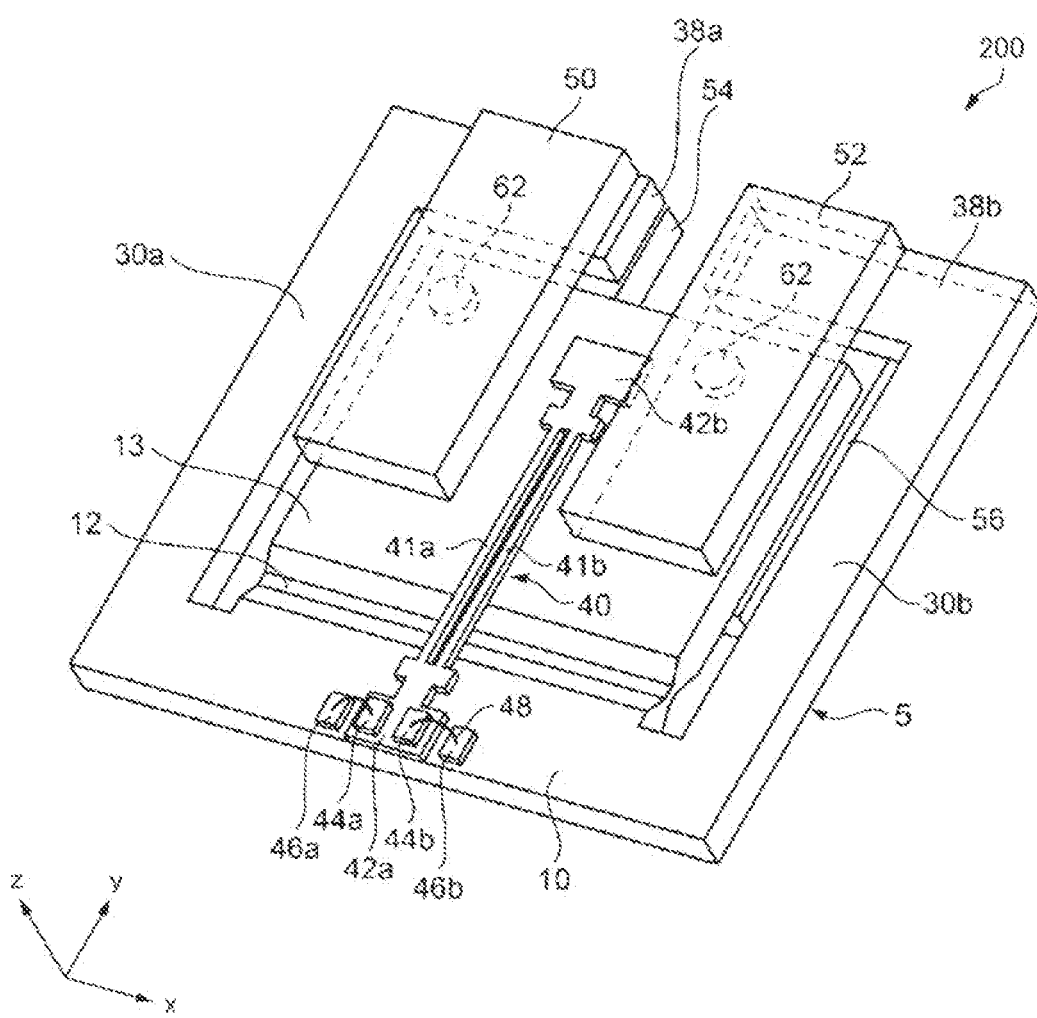
FIG. 3 is a perspective view of a physical quantity sensor.
Figure 4:
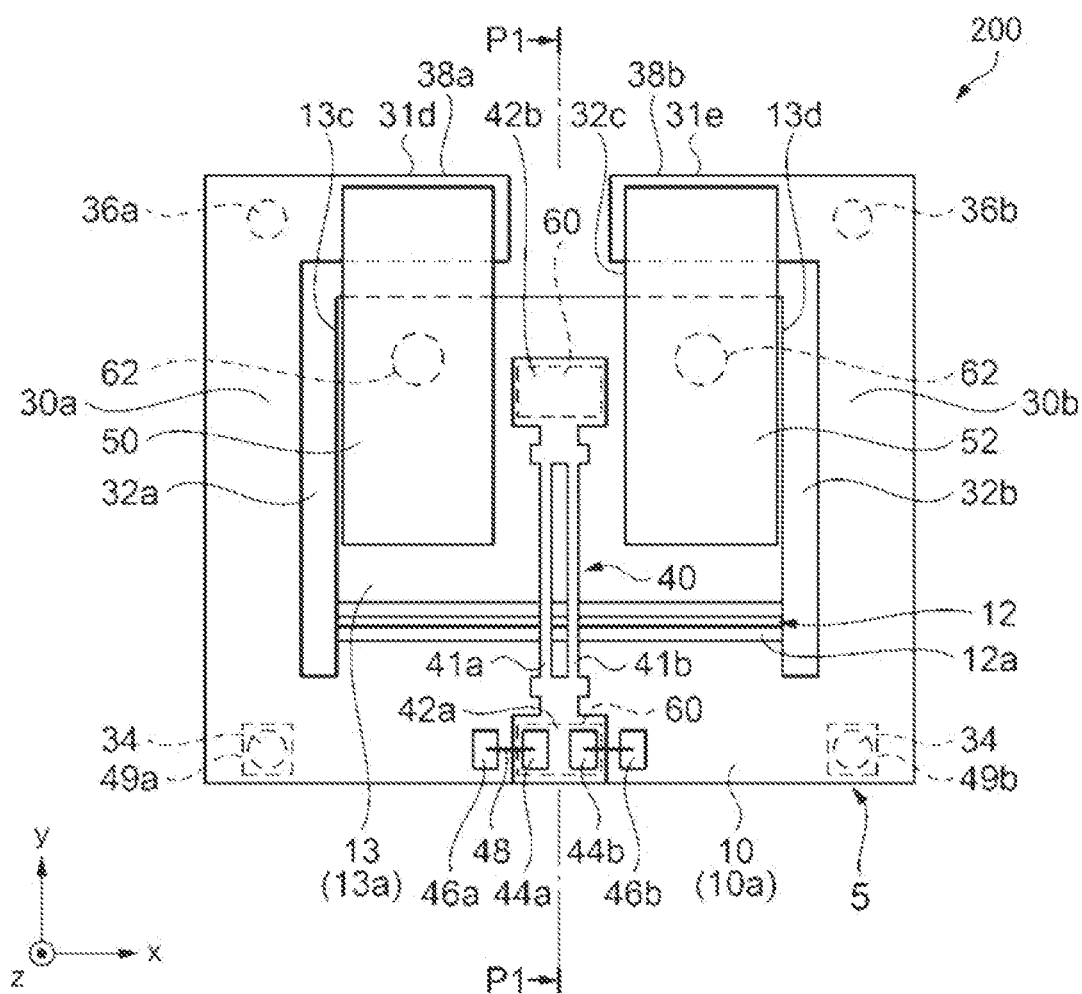
FIG. 4 is a plan view of the physical quantity sensor.
Figure 5:
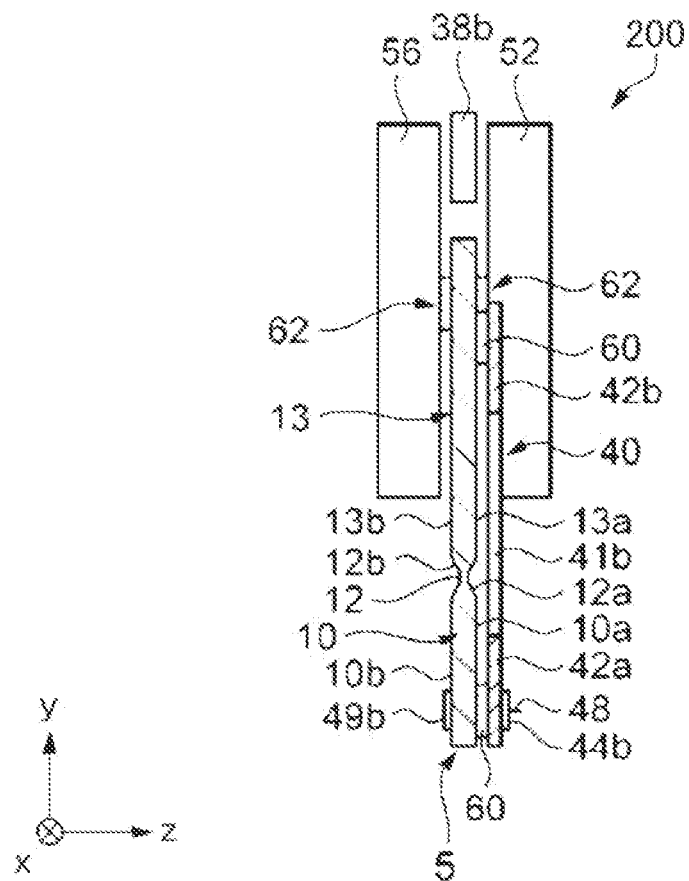
FIG. 5 is a cross-sectional view taken along line P1-P1 in FIG. 4.

FIG. 3 is a perspective view of the physical quantity sensor 200, FIG. 4 is a plan view of the physical quantity sensor 200, and FIG. 5 is a cross-sectional view taken along line P1-P1 of FIG. 4. FIGS. 3 to 5 illustrate only the inside of the package of the physical quantity sensor 200. In the subsequent drawings, for convenience of description, the x axis, the y axis, and the z axis are illustrated as three axes orthogonal to each other. In addition, in the following description, for convenience of description, a plan view when viewed from the z-axis direction as a thickness direction of extension portions 38a and 38b is simply referred to as "plan view".

As illustrated in FIGS. 3 to 5, the physical quantity sensor 200 includes a substrate portion 5 and four weights 50, 52, 54, and 56.

The substrate portion 5 is provided with a plate-like base portion 10 having principal surfaces 10a and 10b extending in the x-axis direction and facing opposite to each other, a joining portion 12 extending from the base portion 10 in the y-axis direction, a movable portion 13 extending in a rectangular shape from the joining portion 12 in a direction opposite to the base portion 10, two support portions 30a and 30b extending along an outer edge of the movable portion 13 from both ends of the base portion 10 in the x-axis direction, and a physical quantity detection element 40 spanned from the base portion 10 to the movable portion 13 and joined to the base portion 10 and the movable portion 13.

In the two support portions 30a and 30b, the support portion 30a is provided with a bonding portion 36a extending along the y axis with the movable portion 13 and a gap 32a therebetween and fixing the support portion 30a, and the extension portion 38a extending along the x axis with the movable portion 13 and a gap 32c therebetween. In other words, the support portion 30a is provided with the extension portion 38a extending along the y axis with the movable portion 13 and the gap 32a therebetween and extending along the x axis with the movable portion 13 and the gap 32c therebetween, and the bonding portion 36a is provided from the support portion 30a to the extension portion 38a. In addition, the support portion 30b is provided with a bonding portion 36b extending along the y axis with the movable portion 13 and a gap 32b therebetween and fixing the support portion 30b, and the extension portion 38b extending along the x axis with the movable portion 13 and the gap 32c therebetween. In other words, the support portion 30b is provided with the extension portion 38b extending along the y axis with the movable portion 13 and the gap 32b therebetween and extending along the x axis with the movable portion 13 and the gap 32c therebetween, and the bonding portion 36b is provided from the support portion 30b to the extension portion 38b.

The bonding portions 36a and 36b provided on the support portions 30a and 30b are for mounting the substrate portion 5 of the physical quantity sensor 200 on an external member such as a package. In addition, the base portion 10, the joining portion 12, the movable portion 13, the support portions 30a and 30b, and the extension portions 38a and 38b may be formed integrally.

The movable portion 13 is surrounded by the support portions 30a and 30b and the base portion 10, and is coupled to the base portion 10 via the joining portion 12 and is cantilevered. The movable portion 13 includes the principal surfaces 13a and 13b facing opposite to each other, a side surface 13c along the support portion 30a, and a side surface 13d along the support portion 30b. The principal surface 13a is a surface facing the same side as the principal surface 10a of the base portion 10, and the principal surface 13b is a surface facing the same side as the principal surface 10b of the base portion 10.

The joining portion 12 is provided between the base portion 10 and the movable portion 13 and couples the base portion 10 to the movable portion 13. The joining portion 12 is formed to have a smaller thickness than those of the base portion 10 and the movable portion 13. The joining portion 12 has grooves 12a and 12b. The grooves 12a and 12b are formed along the X axis. In the joining portion 12, when the movable portion 13 is displaced with respect to the base portion 10, the grooves 12a and 12b function as fulcrums, that is, intermediate hinges. Such a joining portion 12 and the movable portion 13 function as cantilever.

In addition, the physical quantity detection element 40 is fixed to a surface from the principal surface 10a of the base portion 10 to the principal surface 13a of the movable portion 13 by a bonding agent 60. The fixed positions of the physical quantity detection element 40 are two locations of the central positions in the x-axis direction of the principal surface 10a and the principal surface 13a, respectively.

The physical quantity detection element 40 includes abase portion 42a fixed to the principal surface 10a of the base portion 10 with a bonding agent 60, a base portion 42b fixed to the principal surface 13a of the movable portion 13 with a bonding agent 60, and vibration beams 41a and 41b for detecting a physical quantity between the base portion 42a and the base portion 42b. In this case, the shapes of the vibration beams 41a and 41b are prismatic shapes, and when an AC voltage drive signal is applied to excitation electrodes (not illustrated) provided on the vibration beams 41a and 41b, flexural vibration is caused to be separated from or close to each other along the x axis. That is, the physical quantity detection element 40 is a tuning fork type vibrator element.

On the base portion 42a of the physical quantity detection element 40, lead electrodes 44a and 44b are provided. These lead electrodes 44a and 44b are electrically coupled to excitation electrodes (not illustrated) provided on the vibration beams 41a and 41b. The lead electrodes 44a and 44b are electrically coupled to connection terminals 46a and 46b provided on the principal surface 10a of the base portion 10 by metal wires 48. The connection terminals 46a and 46b are electrically coupled to external connection terminals 49a and 49b by wiring (not illustrated). The external connection terminals 49a and 49b are provided on the principal surface 10b side of the base portion 10 that is a surface side on which the physical quantity sensor 200 is mounted on a package or the like so as to overlap a package bonding portion 34 in a plan view. The package bonding portion 34 is for mounting the substrate portion 5 of the physical quantity sensor 200 on an external member such as a package, and is provided at two locations on end portions at both end sides of the base portion 10 in the x-axis direction.

The physical quantity detection element 40 is formed by patterning a quartz crystal substrate cut out at a predetermined angle from a quartz crystal ore or the like by a photolithography technique and an etching technique. In this case, the physical quantity detection element 40 is preferably made of the same material as the base portion 10 and the movable portion 13 in consideration of reducing a difference between the linear expansion coefficient between the base portion 10 and the movable portion 13.

The weights 50, 52, 54, and 56 are rectangular in a plan view, and are provided on the movable portion 13. The weights 50 and 52 are fixed to the principal surface 13a of the movable portion 13 by a bonding member 62, and the weights 54 and 56 are fixed to the principal surface 13b of the movable portion 13 by the bonding member 62. Here, in the weight 50 fixed to the principal surface 13a, the directions of one side as a rectangular edge side and the side surface 13c of the movable portion 13 are aligned, and the directions of the other side and the side surface 31d of the extension portion 38a are aligned in a plan view. By aligning the directions in this manner, the weight 50 is disposed on the side surface 13c side of the movable portion 13, and the weight 50 and the extension portion 38a are disposed so as to overlap each other in a plan view. Similarly, in the weight 52 fixed to the principal surface 13a, the directions of one side as a rectangular edge side and the side surface 13d side of the movable portion 13 are aligned, and the directions of the other side and the side surface 31e of the extension portion 38b are aligned in a plan view. As a result, the weight 52 is disposed on the side surface 13d of the movable portion 13, and the weight 52 and the extension portion 38b are disposed so as to overlap each other in a plan view. In the weight 54 fixed to the principal surface 13b, the directions of one side of a rectangle and the side surface 13c side of the movable portion 13 are aligned, and the directions of the other side and the side surface 31d of the extension portion 38a are aligned in a plan view. As a result, the weight 54 is disposed on the side surface 13c of the movable portion 13, and the weight 54 and the extension portion 38a are disposed so as to overlap each other in a plan view. Similarly, in the weight 56 fixed to the principal surface 13b, the directions of one side of a rectangle and the side surface 13d side of the movable portion 13 are aligned, and the directions of the other side and the side surface 31e of the extension portion 38b are aligned in a plan view. As a result, the weight 56 is disposed on the side surface 13d of the movable portion 13, and the weight 56 and the extension portion 38b are disposed so as to overlap each other in a plan view.

In the weights 50, 52, 54, and 56 disposed in this manner, the weights 50 and 52 are disposed symmetrically with respect to the physical quantity detection element 40, and the weights 54 and 56 are disposed so as to overlap the weights 50 and 52, respectively, in a plan view. These weights 50, 52, 54, and 56 are fixed to the movable portion 13 by bonding members 62 provided at the positions of the center of gravity of the weights 50, 52, 54, and 56, respectively. In addition, the weights 50 and 54 and the extension portion 38a and the weights 52 and 56 and the extension portion 38b overlap each other respectively, in a plan view. Therefore, when an excessive physical quantity is applied, the weights 50, 52, 54, and 56 abut on the extension portions 38a and 38b, and the displacement amounts of the weights 50, 52, 54, and 56 can be suppressed.

The bonding member 62 is made of a silicone resin thermosetting adhesive or the like. The bonding member 62 is applied to the principal surface 13a and the principal surface 13b of the movable portion 13 at two locations, respectively, and the weights 50, 52, 54, and 56 are placed thereon. Thereafter, the weights 50, 52, 54, and 56 are fixed to the movable portion 13 by being cured by heating. Bonding surfaces of the weights 50, 52, 54, and 56 facing the principal surface 13a and the principal surface 13b of the movable portion 13 are rough surfaces. As a result, when the weights 50, 52, 54, and 56 are fixed to the movable portion 13, a bonding area on the bonding surface is increased, and the bonding strength can be improved.

Figure 6:
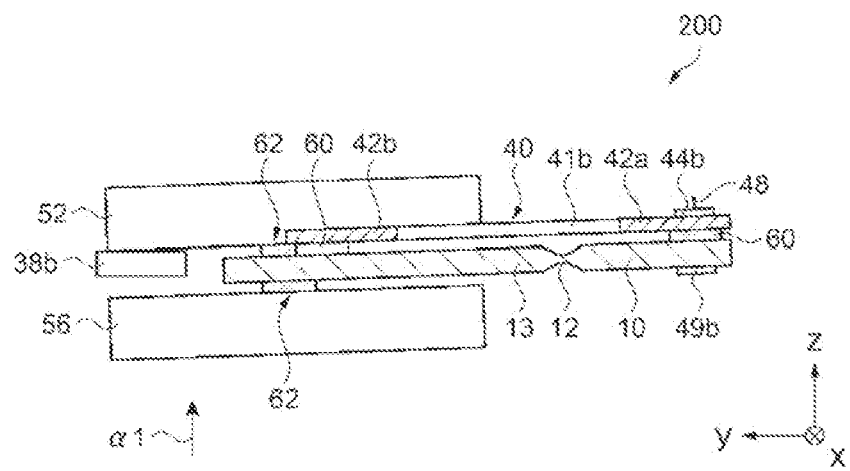
FIG. 6 is an explanatory diagram of an operation of the physical quantity sensor.

As illustrated in FIG. 6, when the acceleration in the +Z direction represented by the arrow a1 is applied to the physical quantity sensor 200 configured as described above, a force acts on the movable portion 13 in the −Z direction, and the movable portion 13 is displaced in the −Z direction with the joining portion 12 as a fulcrum. As a result, a force in a direction where the base portion 42a and the base portion 42b are separated from each other along the Y axis is applied to the physical quantity detection element 40, and tensile stress is generated in the vibration beams 41a and 41b. Therefore, the frequency at which the vibration beams 41a and 41b vibrate increases.

Figure 7:
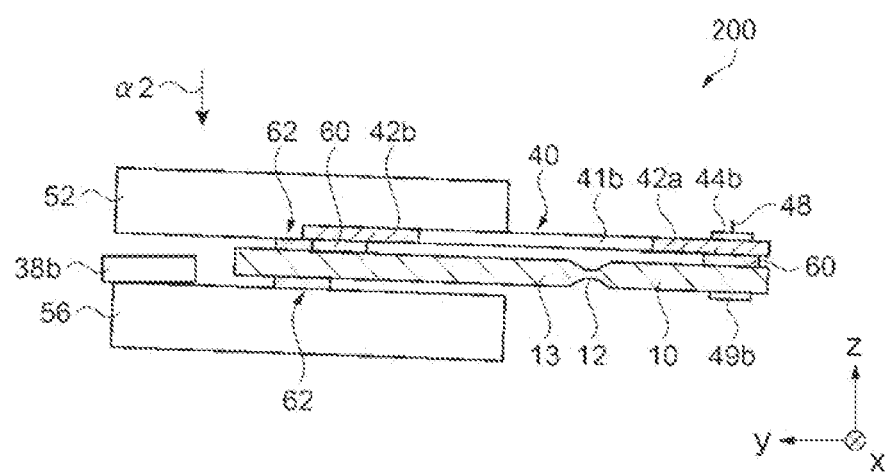
FIG. 7 is an explanatory diagram of an operation of the physical quantity sensor.

On the other hand, as illustrated in FIG. 7, when acceleration in the −Z direction represented by the arrow α2 is applied to the physical quantity sensor 200, a force acts on the movable portion 13 in the +Z direction, and the movable portion 13 is displaced in the +Z direction with the joining portion 12 as a fulcrum. As a result, a force in a direction where the base portion 42a and the base portion 42b approach each other along the Y axis is applied to the physical quantity detection element 40, and compressive stress is generated in the vibration beams 41a and 41b. Therefore, the frequency at which the vibration beams 41a and 41b vibrate decreases.

When the frequency at which the vibration beams 41a and 41b vibrate changes according to the acceleration, the frequency of signals output from the external connection terminals 49a and 49b of the physical quantity sensor 200 changes. The sensor module 1 can calculate the value of the acceleration applied to the physical quantity sensor 200 based on the change in the frequency of the output signal of the physical quantity sensor 200.

In order to increase the detection accuracy of acceleration which is a physical quantity, the joining portion 12 that connects the base portion 10 as a fixed portion and the movable portion 13 is preferably a quartz crystal that is a member having a high Q value. For example, the base portion 10, the support portions 30a and 30b, and the movable portion 13 may be formed of a quartz crystal plate, and the grooves 12a and 12b of the joining portion 12 may be formed by half etching from both surfaces of the quartz crystal plate.

1-3. Functional Configuration of Sensor Module

Figure 8:
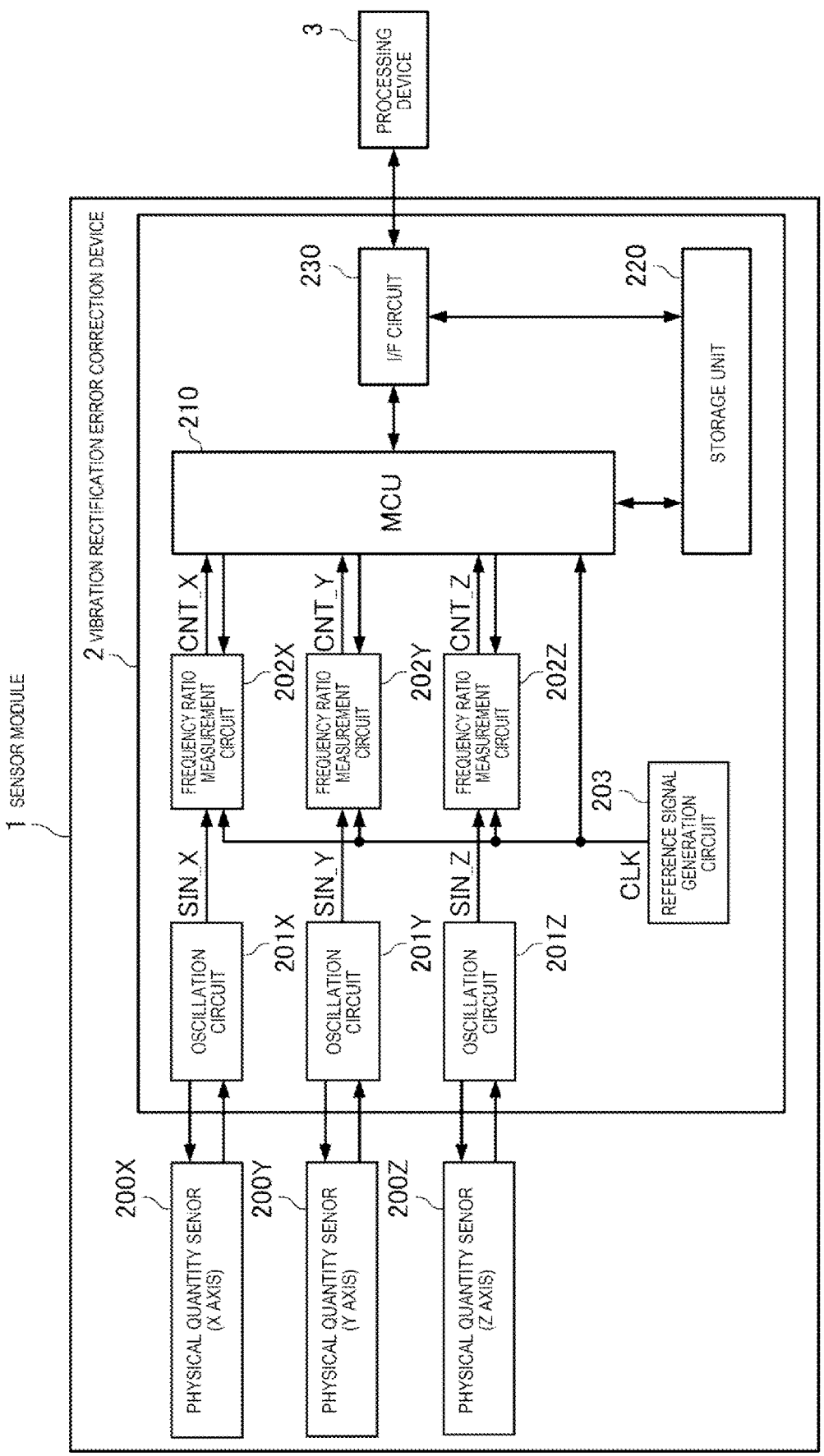
FIG. 8 is a functional block diagram of the sensor module.

FIG. 8 is a functional block diagram of the sensor module 1. As described above, the sensor module 1 includes the physical quantity sensor 200X, 200Y, and 200Z, and the vibration rectification error correction device 2.

The vibration rectification error correction device 2 includes oscillation circuits 201X, 201Y, and 201Z, frequency ratio measurement circuits 202X, 202Y, and 202Z, a micro-control unit 210, a storage unit 220, and an interface circuit 230.

The oscillation circuit 201X amplifies the output signal of the physical quantity sensor 200X to generate a drive signal, and applies the drive signal to the physical quantity sensor 200X. Due to the drive signal, the vibration beams 41a and 41b of the physical quantity sensor 200X vibrate at a frequency corresponding to the acceleration in the X-axis direction, and a signal of the frequency is output from the physical quantity sensor 200X. Further, the oscillation circuit 201X outputs a measured signal SIN_X, which is a rectangular wave signal obtained by amplifying the output signal of the physical quantity sensor 200X, to the frequency ratio measurement circuit 202X. The measured signal SIN_X is a signal based on the output signal of the physical quantity sensor 200X.

Similarly, the oscillation circuit 201Y amplifies the output signal of the physical quantity sensor 200Y to generate a drive signal, and applies the drive signal to the physical quantity sensor 200Y. Due to the drive signal, the vibration beams 41a and 41b of the physical quantity sensor 200Y vibrate at a frequency corresponding to the acceleration in the Y-axis direction, and a signal of the frequency is output from the physical quantity sensor 200Y. Further, the oscillation circuit 201Y outputs a measured signal SIN_Y, which is a rectangular wave signal obtained by amplifying the output signal of the physical quantity sensor 200Y, to the frequency ratio measurement circuit 202Y. The measured signal SIN_Y is a signal based on the output signal of the physical quantity sensor 200Y.

Similarly, the oscillation circuit 201Z amplifies the output signal of the physical quantity sensor 200Z to generate a drive signal, and applies the drive signal to the physical quantity sensor 200Z. Due to the drive signal, the vibration beams 41a and 41b of the physical quantity sensor 200Z vibrate at a frequency corresponding to the acceleration in the Z-axis direction, and a signal of the frequency is output from the physical quantity sensor 200Z. Further, the oscillation circuit 201Z outputs a measured signal SIN_Z, which is a rectangular wave signal obtained by amplifying the output signal of the physical quantity sensor 200Z, to the frequency ratio measurement circuit 202Z. The measured signal SIN_Z is a signal based on the output signal of the physical quantity sensor 200Z.

The reference signal generation circuit 203 generates and outputs a reference signal CLK having a constant frequency. In the present embodiment, the frequency of the reference signal CLK is higher than the frequencies of the measured signals SIN_X, SIN_Y, and SIN_Z. The reference signal CLK preferably has high frequency accuracy, and the reference signal generation circuit 203 may be, for example, a temperature compensated crystal oscillator.

The frequency ratio measurement circuit 202X counts the number of pulses of the reference signal CLK included in a predetermined period of the measured signal SIN_X, which is a signal based on the signal output from the oscillation circuit 201X, and outputs a count value CNT_X. The count value CNT_X is a reciprocal count value corresponding to the frequency ratio of the measured signal SIN_X and the reference signal CLK.

The frequency ratio measurement circuit 202Y counts the number of pulses of the reference signal CLK included in a predetermined period of the measured signal SIN_Y output from the oscillation circuit 201Y, and outputs a count value CNT_Y. The count value CNT_Y is a reciprocal count value corresponding to the frequency ratio of the measured signal SIN_Y and the reference signal CLK.

The frequency ratio measurement circuit 202Z counts the number of pulses of the reference signal CLK included in a predetermined period of the measured signal SIN_Z output from the oscillation circuit 201Z, and outputs a count value CNT_Z. The count value CNT_Z is a reciprocal count value corresponding to the frequency ratio of the measured signal SIN_Z and the reference signal CLK.

The storage unit 220 stores programs and data, and may include a volatile memory such as SRAM or DRAM. SRAM is an abbreviation for static random access memory, and DRAM is an abbreviation for dynamic random access memory.

In addition, the storage unit 220 may include a non-volatile memory such as a semiconductor memory such as EEPROM or flash memory, a magnetic storage device such as a hard disk device, or an optical storage device such as an optical disk device. EEPROM is an abbreviation for electrically erasable programmable read only memory.

The micro-control unit 210 operates in synchronization with the reference signal CLK, and performs predetermined arithmetic processing and control processing by executing a program (not illustrated) stored in the storage unit 220. For example, the micro-control unit 210 measures the physical quantities detected by the physical quantity sensors 200X, 200Y, and 200Z, respectively based on the count value CNT_X output from the frequency ratio measurement circuit 202X, the count value CNT_Y output from the frequency ratio measurement circuit 202Y, and the count value CNT_Z output from the frequency ratio measurement circuit 202Z. Specifically, the micro-control unit 210 converts the count value CNT_X, the count value CNT_Y, and the count value CNT_Z into a measurement value of the physical quantity in the X-axis direction, a measurement value of the physical quantity in the Y-axis direction, and a measurement value of the physical quantity in the Z-axis direction, respectively. For example, the storage unit 220 stores table information that defines the correspondence relationship between the count value and the measurement value of the physical quantity, or information on the relational expression between the count value and the measurement value of the physical quantity, and the micro-control unit 210 may convert each count value into a measurement value of a physical quantity with reference to the information.

The micro-control unit 210 may transmit the measurement value of the physical quantity in the X-axis direction, the measurement value of the physical quantity in the Y-axis direction, and the measurement value of the physical quantity in the Z-axis direction to a processing device 3 via the interface circuit 230. Alternatively, the micro-control unit 210 may write the measurement value of the physical quantity in the X-axis direction, the measurement value of the physical quantity in the Y-axis direction, and the measurement value of the physical quantity in the Z-axis direction to the storage unit 220, respectively, and the processing device 3 may read out each measurement value via the interface circuit 230.

Since the configuration and operation of the frequency ratio measurement circuits 202X, 202Y, and 202Z are the same, any one of the frequency ratio measurement circuits 202X, 202Y, and 202Z will be referred to as a frequency ratio measurement circuit 202 hereafter. Further, anyone of the measured signals SIN_X, SIN_Y, and SIN_Z input to the frequency ratio measurement circuit 202 is referred to as a measured signal SIN, and any one of the count values CNT_X, CNT_Y, and CNT_Z output from the frequency ratio measurement circuit 202 is referred to as a count value CNT.

1-4. Vibration Rectification Error

A vibration rectification error corresponds to the DC offset generated during rectification due to the non-linearity of the response of the sensor module 1 to vibration, and is observed as an abnormal shift of the output offset of the sensor module 1. The vibration rectification error causes a serious measurement error in an application such as an inclinometer using the sensor module 1 in which the DC output of the sensor module 1 is a measurement target as it is. There are three main mechanisms that cause a vibration rectification error: 1. due to asymmetric rails, 2. due to non-linearity of scale factors, and 3. due to structural resonance of the physical quantity sensor 200.

1. Vibration Rectification Error Due to Asymmetric Rails

When the sensitivity axis of the physical quantity sensor 200 is in the direction of gravitational acceleration, the measurement value of the sensor module 1 has an offset corresponding to the gravitational acceleration of 1 g=9.8 m/s². For example, if the dynamic range of the physical quantity sensor 200 is 2 g, vibration can be measured up to 1 g without clipping. If vibration exceeding 1 g is applied in this state, clipping occurs asymmetrically, and therefore the measurement value includes a vibration rectification error.

When the dynamic range is as wide as 15 g, for example, clipping is rarely a problem in a normal usage environment. On the other hand, the physical quantity sensor 200 has a built-in physical protection mechanism for the purpose of preventing damage to the physical quantity detection element 40, and when the vibration level exceeds a certain threshold value, the protection mechanism works, and therefore clipping occurs. In order to prevent clipping, it is necessary to devise an attachment for installing the sensor module 1 and take measures such as damping the vibration of a resonance frequency band.

2. Vibration Rectification Error Due to Non-Linearity of Scale Factors

Figure 9:
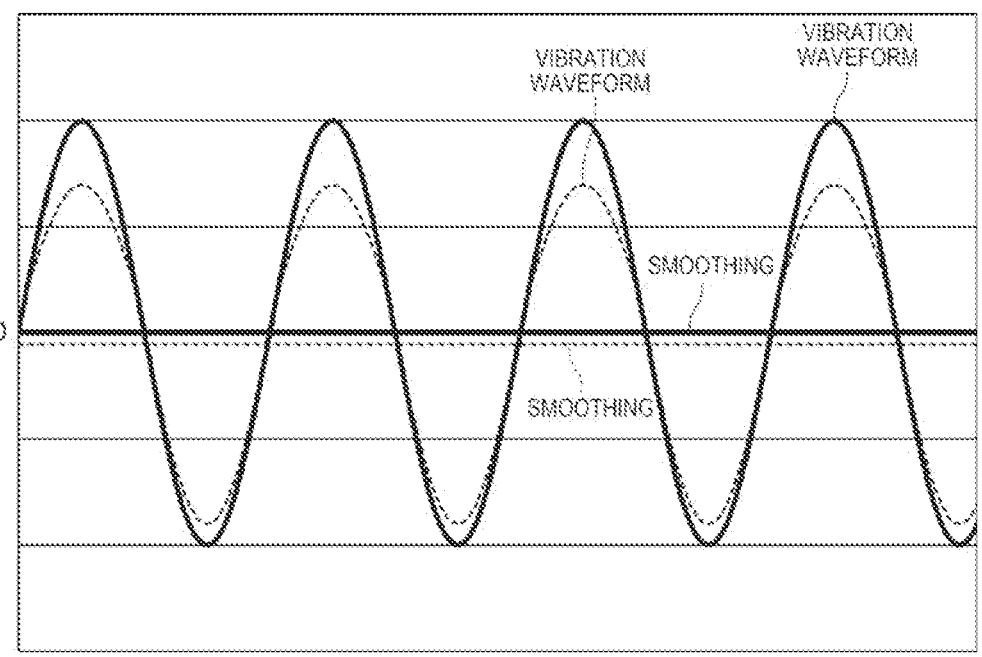
FIG. 9 is a diagram illustrating in principle that a vibration rectification error occurs due to output waveform distortion.

FIG. 9 is a diagram illustrating in principle that a vibration rectification error occurs due to output waveform distortion. In FIG. 9, the solid line indicates a sinusoidal vibration waveform and a smoothed waveform of the vibration waveform, and the broken line indicates an asymmetrical vibration waveform above and below the center of vibration and a smoothed waveform of the vibration waveform. The smoothed waveform indicated by the solid line is 0, while the smoothed waveform indicated by the broken line has a negative value, and an offset occurs during smoothing.

The physical quantity sensor 200 is a frequency change type sensor, and the count value CNT corresponding to the frequency ratio of the measured signal SIN and the reference signal CLK is a reciprocal count value. The relationship between the acceleration applied to the physical quantity sensor 200 and the reciprocal count value has non-linearity. The broken line in FIG. 10 indicates the non-linearity between the applied acceleration and the reciprocal count value. The broken line in FIG. 11 indicates the non-linearity between the applied acceleration and the oscillation frequency of the physical quantity sensor 200. The broken line in FIG. 12 indicates the non-linearity between the oscillation frequency of the physical quantity sensor 200 and the reciprocal count value. The broken line in FIG. 10 is obtained by combining the broken line in FIG. 11 and the broken line in FIG. 12.

Figure 10:
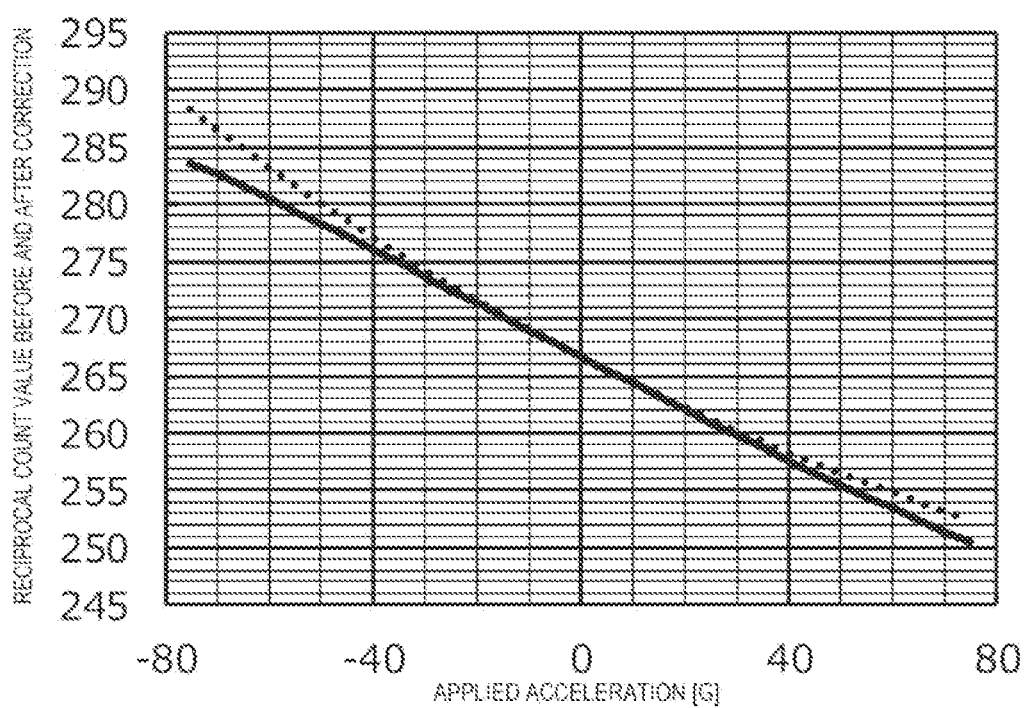
FIG. 10 is a diagram illustrating the non-linearity between applied acceleration and a reciprocal count value.
Figure 11:
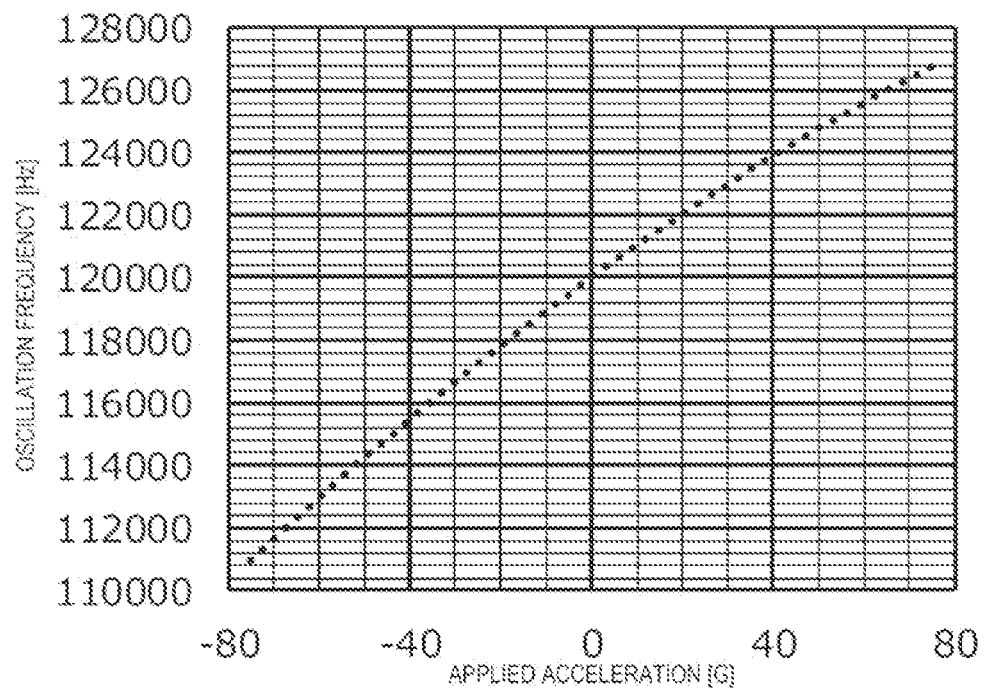
FIG. 11 is a diagram illustrating the non-linearity between applied acceleration and the oscillation frequency of the physical quantity sensor.
Figure 12:
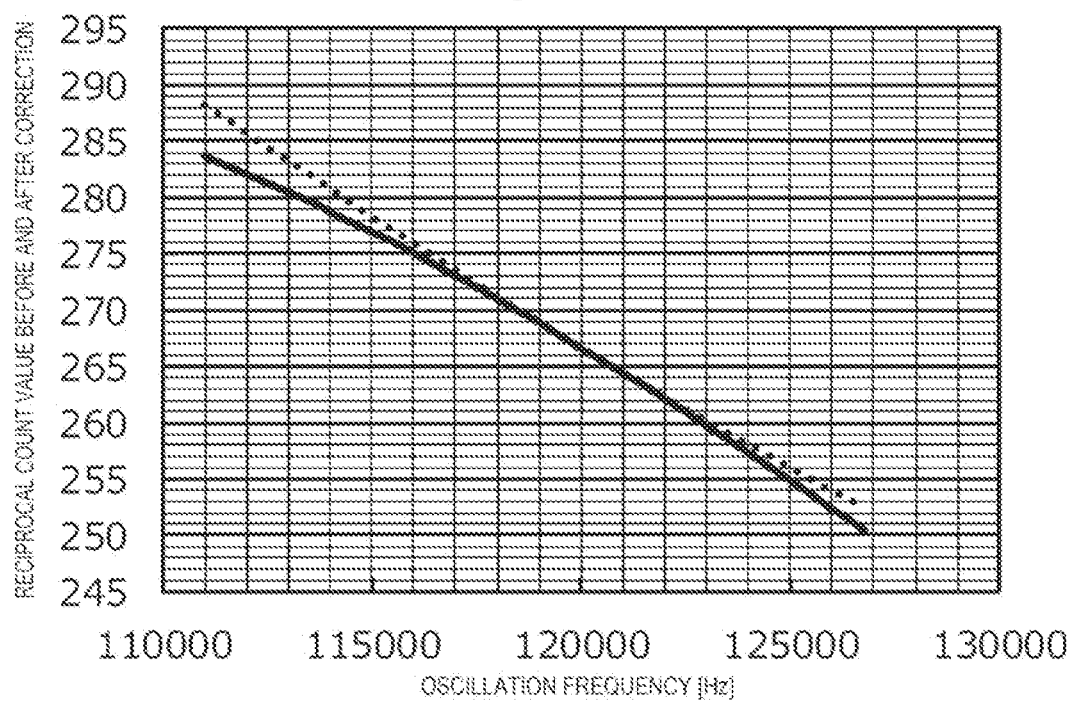
FIG. 12 is a diagram illustrating the non-linearity between the oscillation frequency of the physical quantity sensor and the reciprocal count value.

Here, by correcting the relationship between the oscillation frequency and the reciprocal count value as indicated by the solid line in FIG. 12, the relationship between the acceleration and the reciprocal count value can be made linear as indicated by the solid line in FIG. 10. Specifically, the above-mentioned micro-control unit 210 can correct the count value CNT by using the correction function represented by Equation (1).

$$Y=\{c-d\}^2 \qquad (1)$$

In Equation (1), c is the count value before correction corresponding to the broken line in FIG. 10, Y is the count value after correction corresponding to the solid line in FIG. 10, and d is a coefficient that determines the degree of correction illustrated in FIG. 12. For example, the coefficient d is stored in the storage unit 220 or set by the processing device 3.

3. Vibration Rectification Error Due to Cantilever Resonance

As a principle of detecting acceleration, the physical quantity sensor 200 changes the tension acting on the physical quantity detection element 40 by transmitting the deflection of the cantilever with a weight due to the acceleration to the physical quantity detection element 40 which is a twin tuning fork resonator, thereby changing the oscillation frequency. Therefore, the physical quantity detection element 40 has a resonance frequency due to the structure of the cantilever, and when the cantilever resonance is excited, an inherent vibration rectification error occurs. The cantilever resonance has a frequency higher than the frequency bandwidth corresponding to the range of detectable acceleration, and the vibration component thereof is removed by the low-pass filter inside the vibration rectification error correction device 2, but a vibration rectification error occurs as a bias offset that reflects the asymmetry of vibration. As the amplitude of the cantilever resonance increases, the asymmetry of the output waveform of the physical quantity sensor 200 increases, and therefore the vibration rectification error also increases. Therefore, it is an important issue to reduce the vibration rectification error caused by the cantilever resonance.

In the present embodiment, since the frequency ratio measurement circuit 202 is a reciprocal counting system that counts the number of pulses of the reference signal CLK included in a predetermined period of the measured signal SIN, the timing of acquiring this count value is synchronized with the measured signal SIN. On the other hand, the count value CNT output from the frequency ratio measurement circuit 202 needs to be synchronized with the frequency division signal of the reference signal CLK, and resampling is required because the timing of acquiring the count value of the number of pulses of the reference signal CLK and the frequency division signal of the reference signal CLK are not synchronized. By devising the configuration required for resampling in the frequency ratio measurement circuit 202, it is possible to generate the count value CNT in which the vibration rectification error caused by the cantilever resonance is corrected.

1-5. Configuration of Frequency Ratio Measurement Circuit

Figure 13:
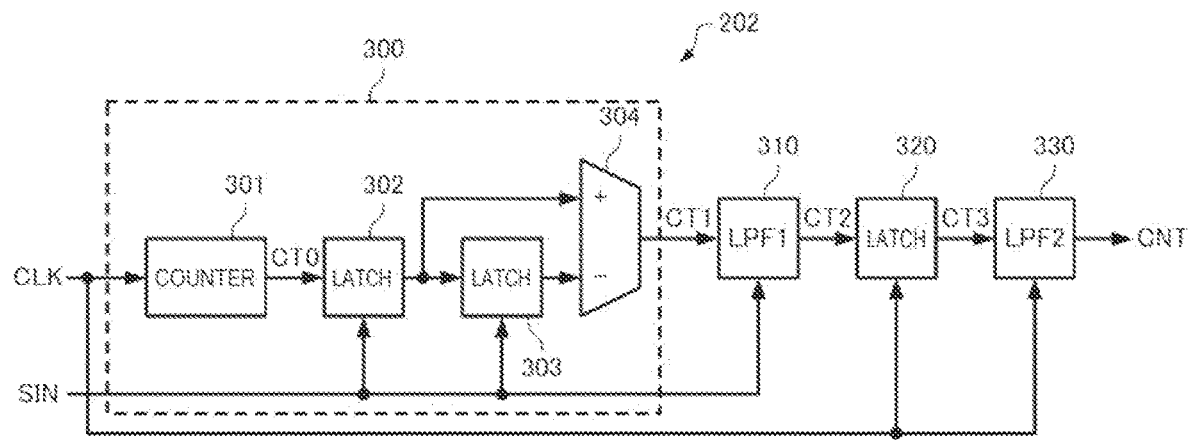
FIG. 13 is a diagram illustrating a configuration example of a frequency ratio measurement circuit.

The frequency ratio measurement circuit 202 measures the frequency ratio of the measured signal SIN and the reference signal CLK by the reciprocal counting system. FIG. 13 is a diagram illustrating a configuration example of the frequency ratio measurement circuit 202. As illustrated in FIG. 13, the frequency ratio measurement circuit 202 includes a frequency delta-sigma modulation circuit 300, a first low-pass filter 310, a latch circuit 320, and a second low-pass filter 330.

The frequency delta-sigma modulation circuit 300 performs frequency delta-sigma modulation on the reference signal CLK by using the measured signal SIN to generate a frequency delta-sigma modulated signal. The frequency delta-sigma modulation circuit 300 includes a counter 301, a latch circuit 302, a latch circuit 303, and a subtractor 304. The counter 301 counts the rising edge of the reference signal CLK and outputs a count value CT0. The latch circuit 302 latches and holds the count value CT0 in synchronization with the rising edge of the measured signal SIN. The latch circuit 303 latches and holds the count value held by the latch circuit 302 in synchronization with the rising edge of the measured signal SIN. The subtractor 304 subtracts the count value held by the latch circuit 303 from the count value held by the latch circuit 302 to generate and output a count value CT1. This count value CT1 is a frequency delta-sigma modulated signal generated by the frequency delta-sigma modulation circuit 300.

This frequency delta-sigma modulation circuit 300 is also called a primary frequency delta-sigma modulator, and latches the count value of the number of pulses of the reference signal CLK twice by the measured signal SIN, and sequentially holds the count value of the number of pulses of the reference signal CLK, triggered by the rising edge of the measured signal SIN. Here, the frequency delta-sigma modulation circuit 300 has been described as performing the latch operation at the rising edge of the measured signal SIN, but the latch operation may be performed at the falling edge or both the rising edge and the falling edge. Further, the subtractor 304 calculates the difference between the two count values held in the latch circuits 302 and 303 to output an increment of the count value of the number of pulses of the reference signal CLK observed during one period of the measured signal SIN with the passage of time without a dead period. When the frequency of the measured signal SIN is fx and the frequency of the reference signal CLK is fc, the frequency ratio is fc/fx. The frequency delta-sigma modulation circuit 300 outputs a frequency delta-sigma modulated signal indicating the frequency ratio as a digital signal sequence.

The first low-pass filter 310 operates in synchronization with the measured signal SIN, and outputs a count value CT2 from which the noise component included in the count value CT1 which is the frequency delta-sigma modulated signal output from the frequency delta-sigma modulation circuit 300 is removed or reduced. In FIG. 13, the first low-pass filter 310 is provided immediately after the frequency delta-sigma modulation circuit 300, but may be provided on the signal path from the output of the frequency delta-sigma modulation circuit 300 to the input of the second low-pass filter 330. The first low-pass filter 310 is an example of the "first filter".

The latch circuit 320 latches the count value CT2 output from the first low-pass filter 310 in synchronization with the rising edge of the reference signal CLK, and holds the latched value as a count value CT3.

The second low-pass filter 330 operates in synchronization with the reference signal CLK, and outputs a count value obtained by removing or reducing a noise component included in the count value CT3 held by the latch circuit 320. The count value output from the second low-pass filter 330 is output to the micro-control unit 210 as the count value CNT. The second low-pass filter 330 is an example of a "second filter".

Figure 14:
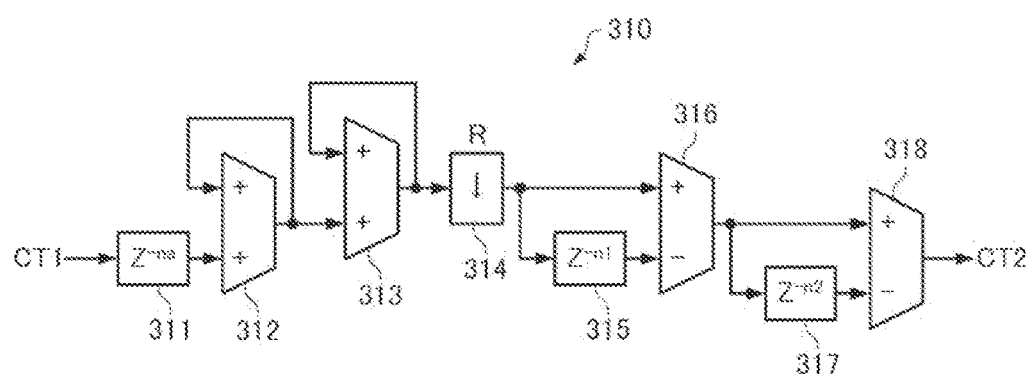
FIG. 14 is a diagram illustrating a configuration example of a first low-pass filter.

FIG. 14 is a diagram illustrating a configuration example of the first low-pass filter 310. In the example of FIG. 14, the first low-pass filter 310 includes a delay element 311, an integrator 312, an integrator 313, a decimator 314, a delay element 315, a differentiator 316, a delay element 317, and a differentiator 318. Each part of the first low-pass filter 310 operates in synchronization with the measured signal SIN.

The delay element 311 outputs a count value obtained by delaying the count value CT1 in synchronization with the measured signal SIN. The number of taps of the delay element 311 is na. For example, the delay element 311 is realized by a shift register in which na registers are serially coupled.

The integrator 312 outputs a count value obtained by integrating the count values output from the delay element 311 in synchronization with the measured signal SIN.

The integrator 313 outputs a count value obtained by integrating the count values output from the integrator 312 in synchronization with the measured signal SIN.

The decimator 314 outputs a count value obtained by decimating the count value output from the integrator 313 to a rate of 1/R in synchronization with the measured signal SIN.

The delay element 315 outputs a count value obtained by delaying the count value output from the decimator 314 in synchronization with the measured signal SIN. The number of taps of the delay element 315 is n1. For example, the delay element 315 is realized by a shift register in which n1 registers are serially coupled.

The differentiator 316 outputs a count value obtained by subtracting the count value output from the delay element 315 from the count value output from the decimator 314.

The delay element 317 outputs a count value obtained by delaying the count value output from the differentiator 316 in synchronization with the measured signal SIN. The number of taps of the delay element 317 is n2. For example, the delay element 317 is realized by a shift register in which n2 registers are serially coupled.

The differentiator 318 outputs the count value CT2 obtained by subtracting the count value output from the delay element 317 from the count value output from the differentiator 316.

The number of taps n1 and n2 and a decimation ratio R are fixed, and the number of taps na is variable. For example, the number of taps na is stored in the storage unit 220 or set by the processing device 3.

The first low-pass filter 310 configured in this way functions as a CIC filter in which the group delay amount is variable depending on the number of taps na. CIC is an abbreviation for cascaded integrator comb.

Figure 15:
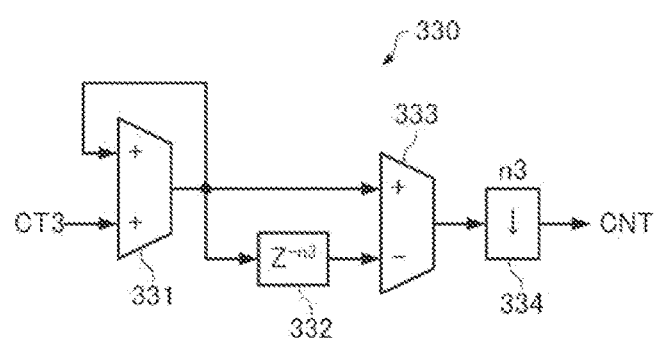
FIG. 15 is a diagram illustrating a configuration example of a second low-pass filter.

FIG. 15 is a diagram illustrating a configuration example of the second low-pass filter 330. In the example of FIG. 15, the second low-pass filter 330 includes an integrator 331, a delay element 332, a differentiator 333, and a decimator 334. Each part of the second low-pass filter 330 operates in synchronization with the reference signal CLK.

The integrator 331 outputs a count value obtained by integrating the count values CT3 in synchronization with the reference signal CLK.

The delay element 332 outputs a count value obtained by delaying the count value output from the integrator 331 in synchronization with the reference signal CLK. The number of taps of the delay element 332 is n3. For example, the delay element 332 is realized by a shift register in which n3 registers are serially coupled.

The differentiator 333 outputs a count value obtained by subtracting the count value output from the delay element 332 from the count value output from the integrator 331.

The decimator 334 outputs the count value CNT obtained by decimating the count value output from the differentiator 333 to a rate of 1/n3 in synchronization with the reference signal CLK.

The number of taps and the decimation ratio n3 are fixed.

Since the second low-pass filter 330 configured in this way integrates the count values CT3 while resampling the count values CT3 with the reference signal CLK, the second low-pass filter 330 functions as a weighted moving average filter in which the count values CT3 are weighted by the duration thereof.

Since the first low-pass filter 310 operates in synchronization with the measured signal SIN, and the second low-pass filter 330 performs resampling synchronized with the reference signal CLK n this way, non-linearity occurs in the input and the output of the frequency ratio measurement circuit 202. Therefore, the count value CNT output from the frequency ratio measurement circuit 202 includes a vibration rectification error due to this non-linearity. This vibration rectification error can be adjusted by adjusting the number of taps na of the delay element 311 included in the first low-pass filter 310.

FIGS. 16A to 16D are diagrams illustrating that the vibration rectification error due to the non-linearity of the input and the output of the frequency ratio measurement circuit 202 can be adjusted. FIGS. 16A to 16D illustrate examples of the case where the period of the measured signal SIN is longer than the period of the reference signal CLK and the update period of the count value CNT is longer than the period of the measured signal SIN, and the horizontal-axis direction corresponds to the passage of time. In FIGS. 16A to 16D, regarding the reference signal CLK, the timing of the rising edge is indicated by the short vertical line. Further, regarding the count values CT1 and CT2, the timing at which the values change is indicated by the short vertical line. In FIGS. 16A to 16D, for the purpose of describing the adjustment mechanism of the vibration rectification error, simplified numerical values are used for easy understanding. Further, it is described that the count value CT2 is fixed before the count value CT1 is fixed although the count value CT2 is not fixed until after the count value CT1 is fixed. But the actual calculation of the count value CT2 is executed after the count value CT1 is fixed.

Figure 16A:
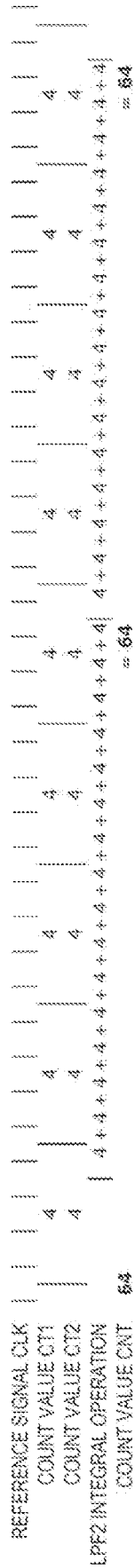
FIGS. 16A to 16D are diagrams illustrating that the vibration rectification error due to the non-linearity of an input and an output of the frequency ratio measurement circuit can be adjusted.
Figure 16B:
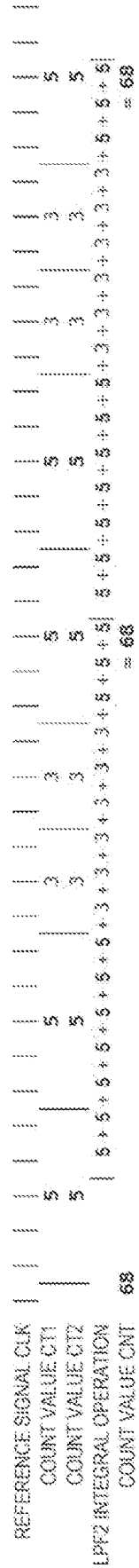
Figure 16C:
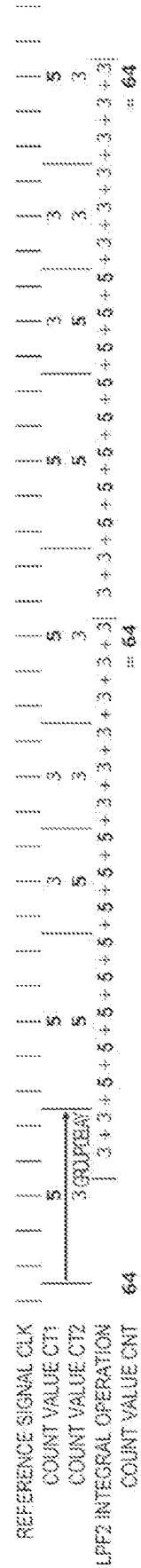
Figure 16D:
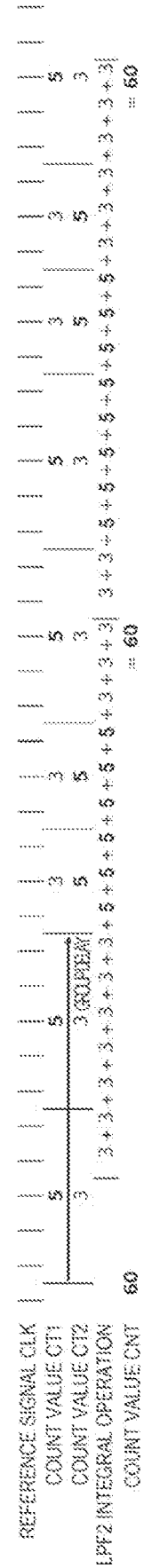

In FIGS. 16A to 16D, FIG. 16A is an example of the case where the period of the measured signal SIN is constant, and FIGS. 16B, 16C, and 16D are examples of the case where the measured signal SIN is frequency-modulated. In FIGS. 16B, 16C, and 16D, the group delay amounts of the first low-pass filters 310 are different from each other. For the sake of simplicity, the period of the reference signal CLK and the period of the measured signal SIN are set to a simple integer ratio, and the count value CT1 input to the first low-pass filter 310 is output as it is with a constant group delay. The second low-pass filter 330 integrates the count values CT3 in which the count value CT2 output from the first low-pass filter 310 is latched in synchronization with the reference signal CLK, and outputs the accumulated value for 16 times as the count value CNT.

In the example of FIG. 16A, the count value CT2 is always 4, and the count value CNT is 4×16=64. In the example of FIG. 16B, since the measured signal SIN is frequency-modulated and the group delay of the first low-pass filter 310 is set to 0, the count value CT2 repeats 5, 5, 3, and 3. Since weighting is performed by time at the time of integration, the count value CNT is 5×10+3×6=68, which is larger than the count value CNT of FIG. 16A. In the example of FIG. 16C, the count value CT2 repeats 5, 5, 3, and 3, as in the example of FIG. 16B, but the case where a group delay occurs in the first low-pass filter 310 is illustrated. As a result of weighting by time at the time of integration, the count value CNT is 5×8+3×8=64, which is the same value as the count value CNT in FIG. 16A. In the example of FIG. 16D, the count value CT2 repeats 5, 5, 3, and 3, as in the examples of FIGS. 16B and 16C, but the case where the group delay occurring in the first low-pass filter 310 is larger than that of the example of FIG. 16C is illustrated. In the example of FIG. 16D, the count value CNT is 5×6+3×10=60, which is smaller than the count value CNT of FIG. 16A.

From the consideration using FIGS. 16A to 16D, it can be qualitatively understood that the vibration rectification error due to the non-linearity of the input and the output of the frequency ratio measurement circuit 202 changes depending on the group delay amount of the first low-pass filter 310. By adjusting the group delay amount of the first low-pass filter 310 so that the vibration rectification error due to the non-linearity of the input and the output of the frequency ratio measurement circuit 202 has the opposite phase to the vibration rectification error caused by the cantilever resonance, it is possible to cancel each other's vibration rectification errors. The group delay amount of the first low-pass filter 310 can be adjusted by setting the number of taps na of the delay element 311.

Figure 17:
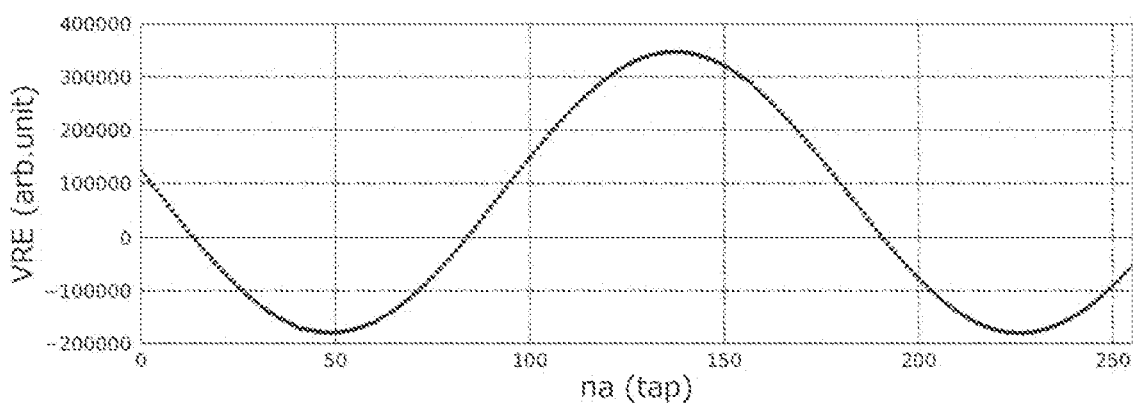
FIG. 17 is a diagram illustrating the dependence of the vibration rectification error included in a measurement value on the number of taps.

FIG. 17 is a diagram illustrating the dependence of the vibration rectification error included in the measurement value by the vibration rectification error correction device 2 on the number of taps na. In FIG. 17, the horizontal axis is the number of taps na, and the vertical axis is the vibration rectification error. VRE on the vertical axis is an abbreviation for vibration rectification error. From FIG. 17, if the number of taps na is set appropriately, it is possible to correct the vibration rectification error and bring the error closer to 0.

Figure 18:
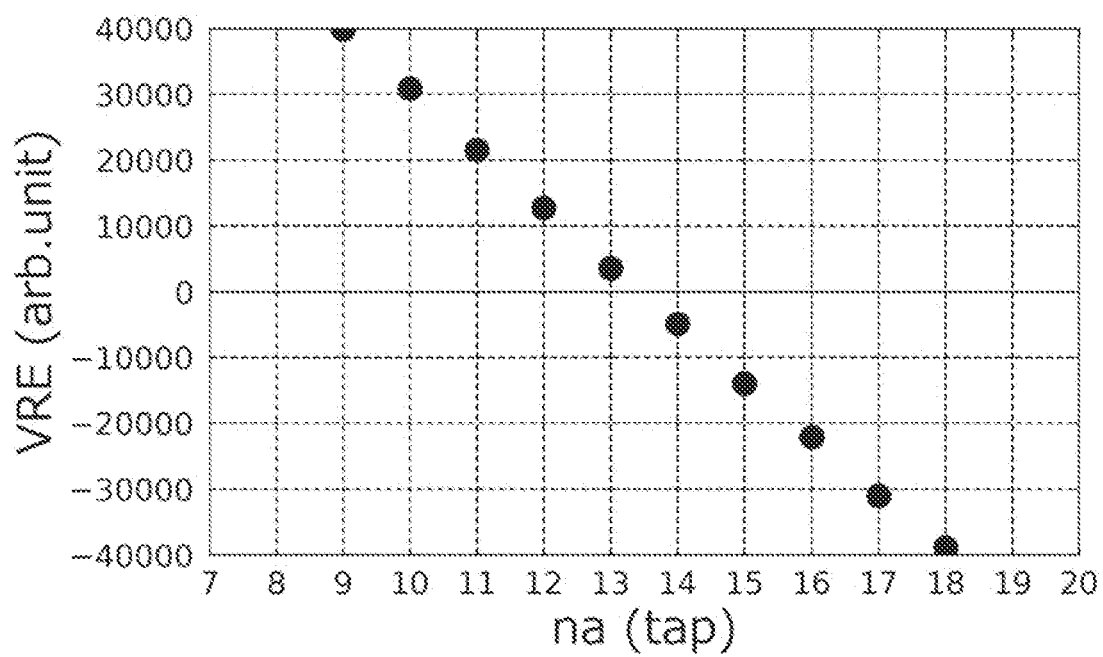
FIG. 18 is an enlarged diagram of a part of FIG. 17.

However, in the first low-pass filter 310 having the configuration of FIG. 14, since the operation of the delay element 311 is synchronized with the measured signal SIN, the adjustment resolution of the group delay amount of the first low-pass filter 310 by setting the number of taps na becomes lower as the period of the measured signal SIN becomes longer. Therefore, as illustrated in FIG. 18, there is a certain limit to the correction resolution of the vibration rectification error. FIG. 18 is an enlarged diagram of a part of FIG. 17, and the vibration rectification error when the number of taps na is set to 13 is the closest to 0, but cannot be closer to 0 any more.

Therefore, in the present embodiment, the first low-pass filter 310 is improved in order to improve the correction resolution of the vibration rectification error. The improved first low-pass filter 310 generates the count value CT2 which is a third signal, based on a first signal having a first group delay amount based on a frequency delta-sigma modulated signal and a second signal having a second group delay amount that is different from the first group delay amount based on the frequency delta-sigma modulated signal. Therefore, the second low-pass filter 330 receives the count value CT3, which is a signal based on the count value CT2, which is the third signal generated by the first low-pass filter 310, and outputs the count value CNT, which is a fourth signal.

Here, it is assumed that the fourth signal output from the second low-pass filter 330 is Lout(t). Further, it is assumed that a fifth signal output from the second low-pass filter 330 is $Lout_{na}(t)$ when the first signal is input to the second low-pass filter 330, and a sixth signal output from the second low-pass filter 330 is $Lout_{nb}(t)$ when the second signal is input to the second low-pass filter 330. na and nb are information for identifying the first group delay amount of the first signal and the second group delay amount of the second signal, which is the number of taps of the two delay elements included in the first low-pass filter 310 in the present embodiment. At this time, for example, as in Equation (2), the fourth signal Lout(t) is a signal obtained by weighting and adding the fifth signal $Lout_{na}(t)$ and the sixth signal $Lout_{nb}(t)$ with positive real numbers a and b, respectively.

$$Lout(t)=(a \cdot Lout_{na}(t)+b \cdot Lout_{nb}(t))/(a+b) \tag{2}$$

That is, the fourth signal Lout(t) may be a signal obtained by dividing the sum of the product of the fifth signal $Lout_{na}(t)$ and the positive real number a and the product of the sixth signal $Lout_{nb}(t)$ and the positive real number b by the sum of the real number a and the real number b.

One of the real number a and the real number b may be 1, and the other may be other than 1. Further, the real number a and the real number b may be other than 1.

Here, in the present embodiment, a first vibration rectification error $VRE_{na}$ included in the fifth signal $Lout_{na}(t)$ and a second vibration rectification error $VRE_{nb}$ included in the sixth signal $Lout_{nb}(t)$ have different polarities. Therefore, as in Equation (2), the fourth signal Lout(t) with corrected vibration rectification error is obtained by weighting and adding the fifth signal $Lout_{na}(t)$ and the sixth signal $Lout_{nb}$ (t) with the positive real numbers a and b, respectively.

Figure 19:
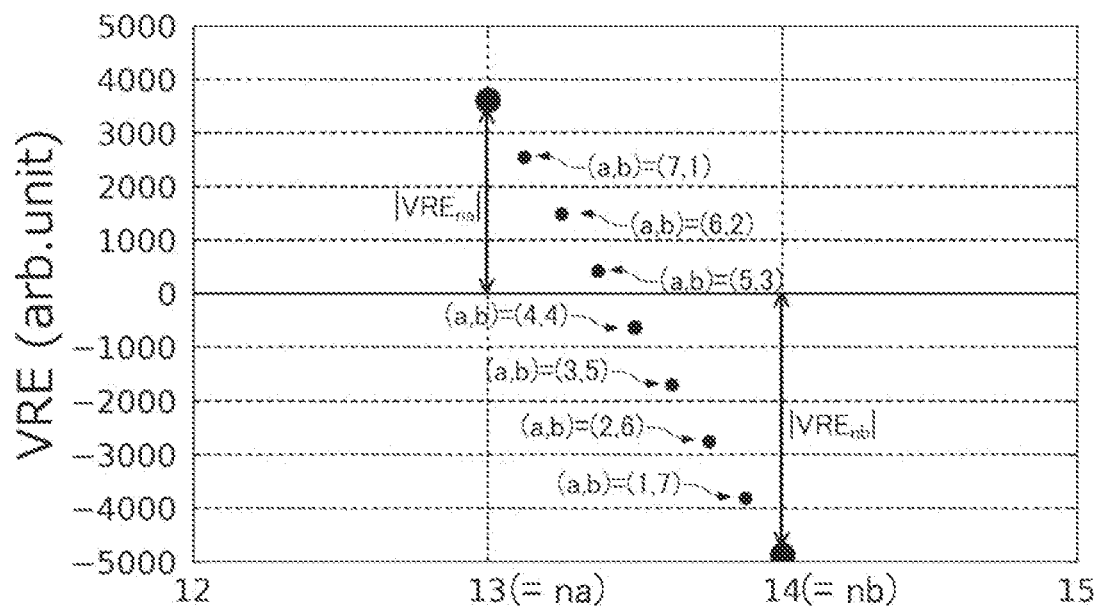
FIG. 19 is a diagram illustrating that the correction resolution of the vibration rectification error is increased.

FIG. 19 is a diagram plotting the vibration rectification error in 7 cases included in the fourth signal Lout (t) when the real numbers a and b are natural numbers satisfying a+b=8 and na=13 and nb=14 in Equation (2). As illustrated in FIG. 19, the correction resolution of the vibration rectification error can be improved by Equation (2).

The ratio of the real number a and the real number b may be the ratio of the absolute value of the second vibration rectification error $VRE_{nb}$ and the absolute value of the first vibration rectification error $VRE_{na}$. In this way, as is clear from FIG. 19, the vibration rectification error included in the fourth signal Lout(t) can be set to 0.

In Equation (2), the division by (a+b) has a meaning of scaling, but has no effect from the viewpoint of obtaining the correction effect of the vibration rectification error. Therefore, the division by (a+b) may be omitted as in Equation (3).

$$Lout(t)=a \cdot Lout_{na}(t)+b \cdot Lout_{nb}(t) \tag{3}$$

That is, the fourth signal Lout(t) may be a signal obtained by adding the product of the fifth signal $Lout_{na}(t)$ and the positive real number a and the product of the sixth signal $Lout_{nb}(t)$ and the positive real number b.

Figure 20:
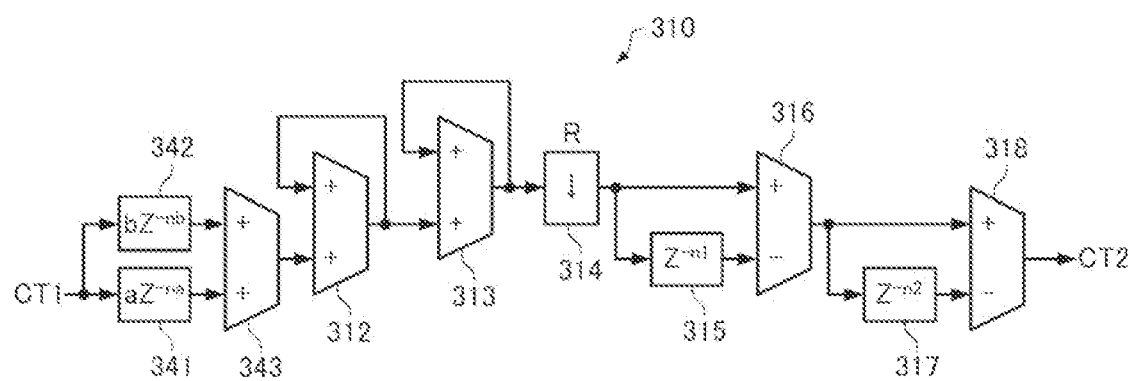
FIG. 20 is a diagram illustrating a configuration example of the first low-pass filter having an increased correction resolution of vibration rectification error.

FIG. 20 is a diagram illustrating a configuration example of the first low-pass filter 310 for obtaining a fourth signal Lout(t) satisfying Equation (3). In FIG. 20, the same components as in FIG. 14 are designated by the same reference numerals.

In the example of FIG. 20, the first low-pass filter 310 includes the integrator 312, the integrator 313, the decimator 314, the delay element 315, the differentiator 316, the delay element 317, the differentiator 318, a delay element 341, a delay element 342, and an adder 343. Each part of the first low-pass filter 310 operates in synchronization with the measured signal SIN.

The delay element 341 outputs a count value delayed by multiplying the count value CT1 which is a delta-sigma modulated signal by a in synchronization with the measured signal SIN. The number of taps of the delay element 341 is na. For example, the delay element 341 is realized by a multiplier and a shift register in which na registers are serially coupled.

The delay element 342 outputs a count value delayed by multiplying the count value CT1 which is a delta-sigma modulated signal by b in synchronization with the measured signal SIN. The number of taps of the delay element 342 is nb. For example, the delay element 342 is realized by a multiplier and a shift register in which nb registers are serially coupled.

The adder 343 outputs a count value obtained by adding the count value output from the delay element 341 and the count value output from the delay element 342.

The integrator 312 outputs a count value obtained by integrating the count values output from the adder 343 in synchronization with the measured signal SIN.

Since the operations of the decimator 314, the delay element 315, the differentiator 316, the delay element 317, and the differentiator 318 are the same as those in FIG. 14, the description thereof will be omitted. The count value CT2 output from the differentiator 318 corresponds to the third signal.

Figure 21:
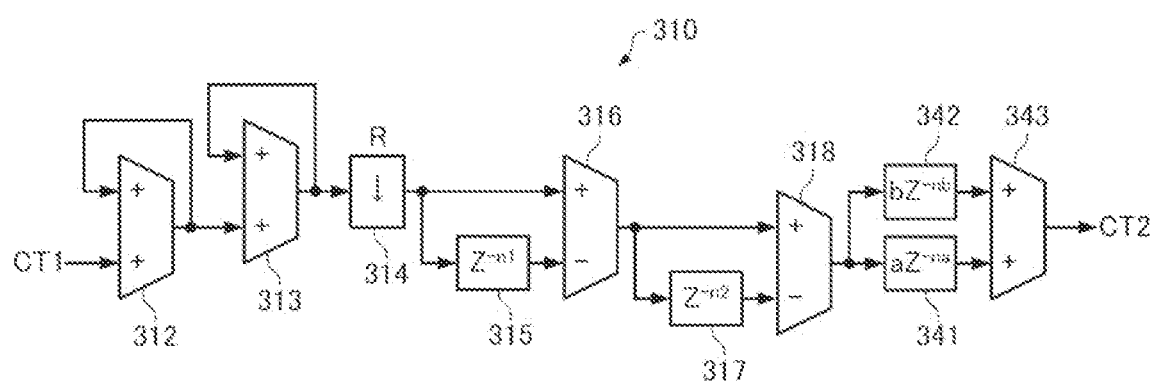
FIG. 21 is a diagram illustrating another configuration example of the first low-pass filter having an improved correction resolution of vibration rectification error.

FIG. 21 is a diagram illustrating another configuration example of the first low-pass filter 310 for obtaining the fourth signal Lout(t) satisfying Equation (3). In FIG. 21, the same components as those in FIG. 20 are designated by the same reference numerals.

In the example of FIG. 21, the first low-pass filter 310 includes the integrator 312, the integrator 313, the decimator 314, the delay element 315, the differentiator 316, the delay element 317, the differentiator 318, a delay element 341, a delay element 342, and an adder 343. Each part of the first low-pass filter 310 operates in synchronization with the measured signal SIN.

Since the operations of the integrator 312, the integrator 313, the decimator 314, the delay element 315, the differentiator 316, the delay element 317, and the differentiator 318 are the same as those in FIG. 14, the description thereof will be omitted.

The delay element 341 outputs a count value delayed by multiplying the count value output from the differentiator 318 by a in synchronization with the measured signal SIN. The number of taps of the delay element 341 is na. For example, the delay element 341 is realized by a multiplier and a shift register in which na registers are serially coupled.

The delay element 342 outputs a count value delayed by multiplying the count value output from the differentiator 318 by b in synchronization with the measured signal SIN. The number of taps of the delay element 342 is nb. For example, the delay element 341 is realized by a multiplier and a shift register in which nb registers are serially coupled.

The adder 343 outputs the count value CT2 obtained by adding the count value output from the delay element 341 and the count value output from the delay element 342. The count value CT2 output from the adder 343 corresponds to the third signal.

For example, in the manufacturing step of the sensor module 1, the inspection device acquires the vibration rectification error of the measurement value while keeping the numbers of taps na and nb at the same value and sequentially changing the numbers of taps na and nb via the interface circuit 230 to find the relationship between the number of taps and the vibration rectification error. The inspection device calculates the numbers of taps na and nb and the real numbers a, b at which the vibration rectification error of the measurement value is reduced based on the relationship between the number of taps and the vibration rectification error, and writes the calculated the numbers of taps na and nb and the real numbers a and b to the non-volatile memory of the storage unit 220 via the interface circuit 230. As described above, the numbers of taps na and nb, and the real numbers a and b are stored in the storage unit 220 of the vibration rectification error correction device 2 before the sensor module 1 starts the measurement. The numbers of taps na and nb, and real numbers a and b stored in the storage unit 220 are read out by the micro-control unit 210 and set in the first low-pass filter 310.

Figure 22:
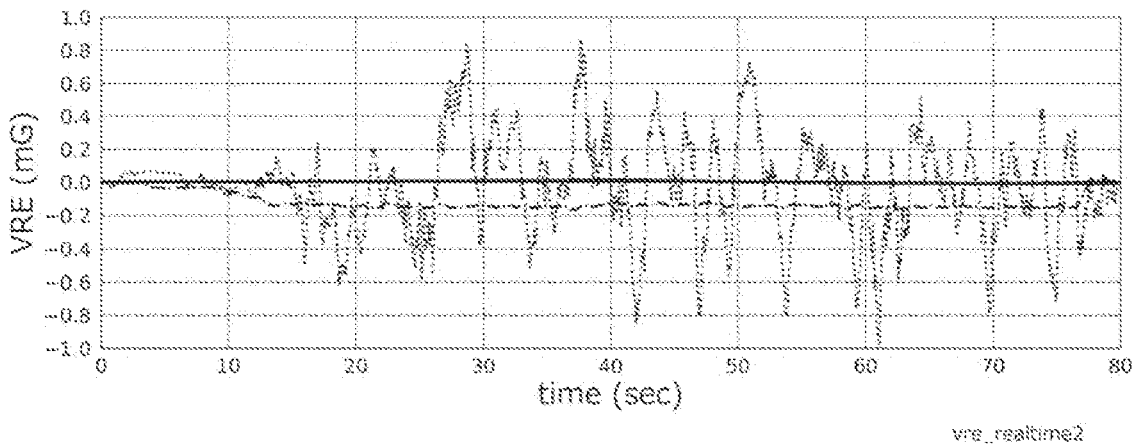
FIG. 22 is a diagram illustrating a measurement result of a vibration rectification error.

FIG. 22 illustrates the result of measuring the vibration rectification error that occurs when the cantilever resonance is excited by applying random vibration to the physical quantity sensor 200. In FIG. 22, the dotted line is the vibration rectification error that occurs when the correction is not performed. The alternate long and short dash line is the vibration rectification error that occurs when the first low-pass filter 310 has the configuration of FIG. 14. The solid line is the vibration rectification error that occurs when the first low-pass filter 310 has the configuration of FIG. 20 or 21. In FIG. 22, as illustrated by the solid line, it can be seen that the vibration rectification error is significantly reduced by adopting the first low-pass filter 310 having the configuration of FIG. 20 or FIG. 21.

1-6. Vibration Rectification Error Correction Method

Figure 23:
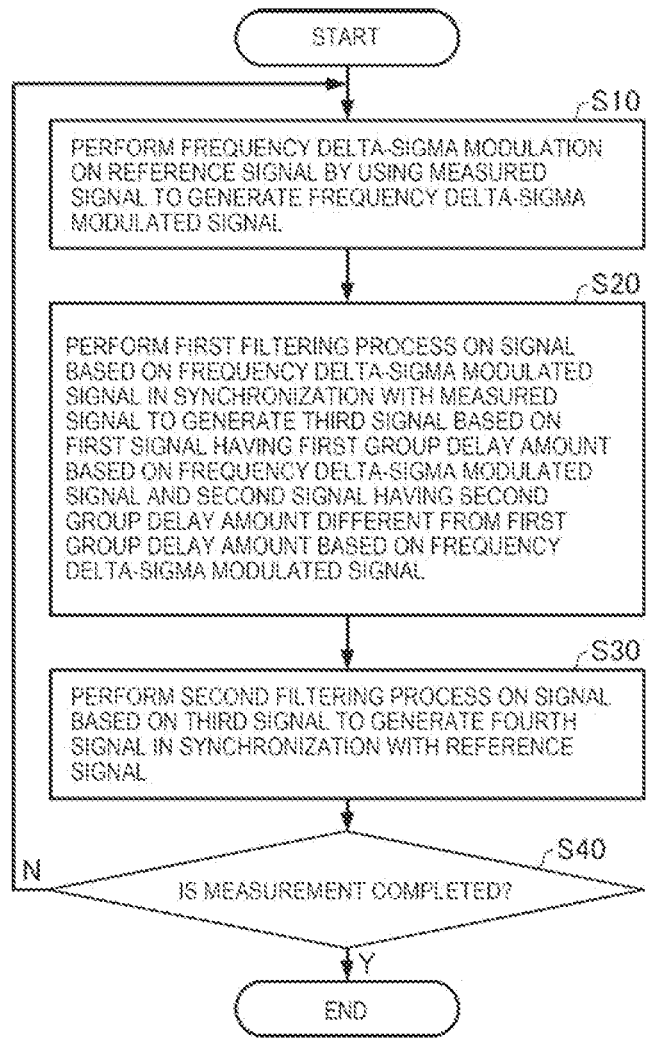
FIG. 23 is a flowchart illustrating an example of a procedure of a vibration rectification error correction method.

FIG. 23 is a flowchart illustrating an example of a procedure of the vibration rectification error correction method by the vibration rectification error correction device 2.

As illustrated in FIG. 23, first, in step S10, the vibration rectification error correction device 2 performs frequency delta-sigma modulation on the reference signal CLK by using the measured signal SIN to generate a frequency delta-sigma modulated signal.

Next, in step S20, the vibration rectification error correction device 2 performs a first filtering process on the signal based on the frequency delta-sigma modulated signal generated in the step S10 in synchronization with the measured signal SIN to generate the third signal based on the first signal having the first group delay amount based on the frequency delta-sigma modulated signal and the second signal having the second group delay amount that is different from the first group delay amount based on the frequency delta-sigma modulated signal.

Next, in step S30, the vibration rectification error correction device 2 performs a second filtering process on a signal based on the third signal generated in step S20 in synchronization with the reference signal CLK to generate the fourth signal Lout(t). Here, the first vibration rectification error $VRE_{na}$ included in the fifth signal $Lout_{na}(t)$ generated when the second filtering process is performed on the first signal and the second vibration rectification error included in the sixth signal $Lout_{nb}(t)$ generated when the second filtering process is performed on the second signal have different polarities.

In step S40, the vibration rectification error correction device 2 repeats steps S10, S20, and S30 until the measurement is completed.

1-7. Operational Effects

As described above, in the sensor module 1 of the first embodiment, in the vibration rectification error correction device 2, because the first low-pass filter 310 operates in synchronization with the measured signal SIN, and the second low-pass filter 330 operates in synchronization with the reference signal CLK different from the measured signal SIN, non-linearity occurs in the relationship between the frequency delta-sigma modulated signal and the fifth signal $Lout_{na}(t)$ and the sixth signal $Lout_{nb}(t)$. Due to the difference between the first group delay amount of the first signal and the second group delay amount of the second signal, the non-linearity of the relationship between the frequency delta-sigma modulated signal and the fifth signal $Lout_{na}(t)$ and the non-linearity of the relationship between the frequency delta-sigma modulated signal and the sixth signal $Lout_{nb}(t)$ are different to some degree. Therefore, according to the sensor module 1 of the first embodiment, in the vibration rectification error correction device 2, because the correction resolution of vibration rectification error is improved by using the first signal and the second signal in which the first group delay amount and the second group delay amount are set to appropriate values so that the first vibration rectification error $VRE_{na}$ included in the fifth signal $Lout_{na}(t)$ and the second vibration rectification error $VRE_{nb}$ included in the sixth signal $Lout_{nb}(t)$ have different polarities, the vibration rectification error included in the fourth signal Lout(t) can be effectively reduced. As a result, the vibration rectification error of the measurement value can be effectively reduced, and the measurement accuracy of the physical quantity is improved.

Further, according to the sensor module 1 of the first embodiment, in the vibration rectification error correction device 2, since the fourth signal Lout(t) having a reduced number of bits can be obtained by scaling in Equation (2), processing based on the fourth signal Lout(t) can be simplified.

Further, according to the sensor module 1 of the first embodiment, in the vibration rectification error correction device 2, by omitting the scaling processing of the fourth signal Lout(t) as in Equation (3), the correction processing of the vibration rectification error is simplified and the circuit area of the first low-pass filter 310 is reduced without impairing the effect of reducing the vibration rectification error included in the fourth signal Lout(t).

Further, according to the sensor module 1 of the first embodiment, in the vibration rectification error correction device 2, if one of the real numbers a and b of Equation (2) or Equation (3) is 1 and the other is other than 1, the product of the fifth signal $Lout_{na}(t)$ and the real number a or the product of the sixth signal $Lout_{nb}(t)$ and the real number b is omitted, and therefore the correction processing of the vibration rectification error is simplified and the circuit area of the first low-pass filter 310 is reduced.

Further, according to the sensor module 1 of the first embodiment, in the vibration rectification error correction device 2, by setting the real numbers a and b of Equation (2) or Equation (3) to appropriate values other than 1, the effect of reducing the vibration rectification error included in the fourth signal Lout(t) can be improved.

Further, according to the sensor module 1 of the first embodiment, in the vibration rectification error correction device 2, the vibration rectification error included in the fourth signal Lout(t) can be made substantially 0 by setting the ratio of the real number a and the real number b of Equation (2) or Equation (3) to the ratio of the absolute value of the second vibration rectification error $VRE_{nb}$ and the absolute value of the first vibration rectification error $VRE_{na}$.

Further, according to the sensor module 1 of the first embodiment, in the vibration rectification error correction device 2, by storing the numbers of taps na and nb, and the real numbers a and b in the non-volatile memory of the storage unit 220, the vibration rectification error included in the fourth signal Lout(t) can be reduced without receiving the information of the first group delay amount and the second group delay amount from the processing device 3.

2. Second Embodiment

Hereinafter, regarding a sensor module of a second embodiment, the same components as those of the first embodiment are designated by the same reference numerals, the description overlapping with the first embodiment will be omitted or simplified, and the contents different from those of the first embodiment will be mainly described.

Since the structure and functional configuration of the sensor module 1 of the second embodiment are the same as those of the first embodiment, the illustration and description thereof will be omitted. In the sensor module 1 of the second embodiment, the configuration of the first low-pass filter 310 is different from that of the first embodiment.

In the first low-pass filter 310 having the configuration of FIG. 20 or FIG. 21 for obtaining the fourth signal Lout(t) satisfying Equation (3), the delay element 341 needs a multiplier for multiplying the count value and the real number a, and the delay element 342 needs a multiplier for multiplying the count value and the real number b. Therefore, the circuit area of the first low-pass filter 310 becomes large.

Therefore, in the second embodiment, for example, as in Equation (4), the first low-pass filter 310 is configured so that the fourth signal Lout(t) is obtained when the fifth signal $Lout_{na}(t)$ and the sixth signal $Lout_{nb}(t)$ are added without being weighted by the real numbers a and b.

$$Lout(t)=(Lout_{na}(t)+Lout_{nb}(t))/2 \quad (4)$$

Equation (4) is an equation in which 1 is substituted for the real numbers a and b of Equation (2). That is, the fourth signal Lout(t) may be a signal obtained by dividing the sum of the product of the fifth signal $Lout_{na}(t)$ and the positive real number a and the product of the sixth signal $Lout_{nb}(t)$ and the positive real number b by the sum of the real number a and the real number b, and the real number a may be 1, and the real number b may be 1.

In Equation (4), the division by 2 has a meaning of scaling, but has no effect from the viewpoint of obtaining the correction effect of the vibration rectification error. Therefore, the division by 2 may be omitted as in Equation (5).

$$Lout(t)=(Lout_{na}(t)+Lout_{nb}(t)) \quad (5)$$

Equation (5) is an equation in which 1 is substituted for the real numbers a and b of Equation (3). That is, the fourth signal Lout(t) may be a signal obtained by adding the product of the fifth signal $Lout_{na}(t)$ and the positive real number a and the product of the sixth signal $Lout_{nb}(t)$ and the positive real number b, and the real number a may be 1, and the real number b may be 1.

Figure 24:
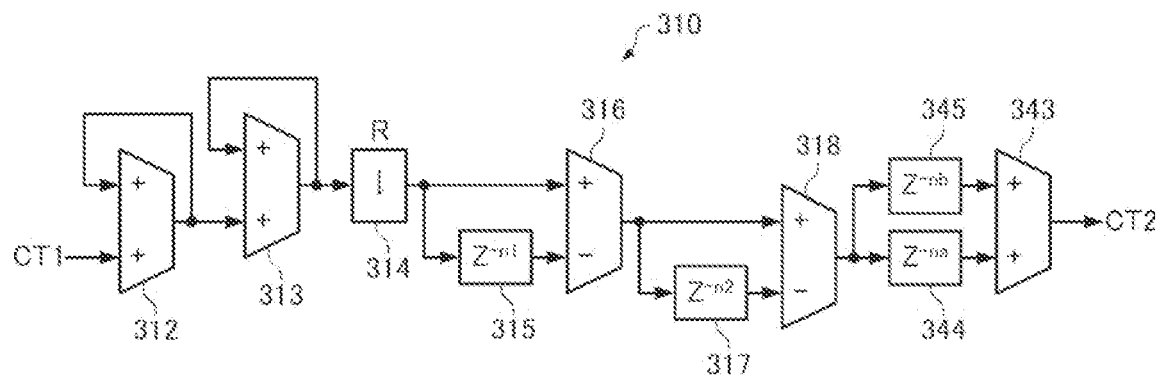
FIG. 24 is a diagram illustrating a configuration example of a first low-pass filter according to a second embodiment.

FIG. 24 is a diagram illustrating a configuration example of the first low-pass filter 310 for obtaining the fourth signal Lout(t) satisfying Equation (5). In FIG. 24, the same components as those in FIG. 14, FIG. 20 or FIG. 21 are designated by the same reference numerals.

In the example of FIG. 24, the first low-pass filter 310 includes an integrator 312, an integrator 313, a decimator 314, a delay element 315, a differentiator 316, a delay element 317, and a differentiator 318. It has an adder 343, a delay element 344, and a delay element 345. Each part of the first low-pass filter 310 operates in synchronization with the measured signal SIN.

Since the operations of the integrator 312, the integrator 313, the decimator 314, the delay element 315, the differentiator 316, the delay element 317, and the differentiator 318 are the same as those in FIG. 14, the description thereof will be omitted.

The delay element 344 outputs a count value obtained by delaying the count value output from the differentiator 318 in synchronization with the measured signal SIN. The number of taps of the delay element 344 is na. For example, the delay element 341 is realized by a shift register in which na registers are serially coupled.

The delay element 345 outputs a count value obtained by delaying the count value output from the differentiator 318 in synchronization with the measured signal SIN. The number of taps of the delay element 345 is nb. For example, the delay element 345 is realized by a shift register in which nb registers are serially coupled.

The adder 343 outputs the count value CT2 obtained by adding the count value output from the delay element 344 and the count value output from the delay element 345. The count value CT2 output from the adder 343 corresponds to the third signal.

Figure 25:
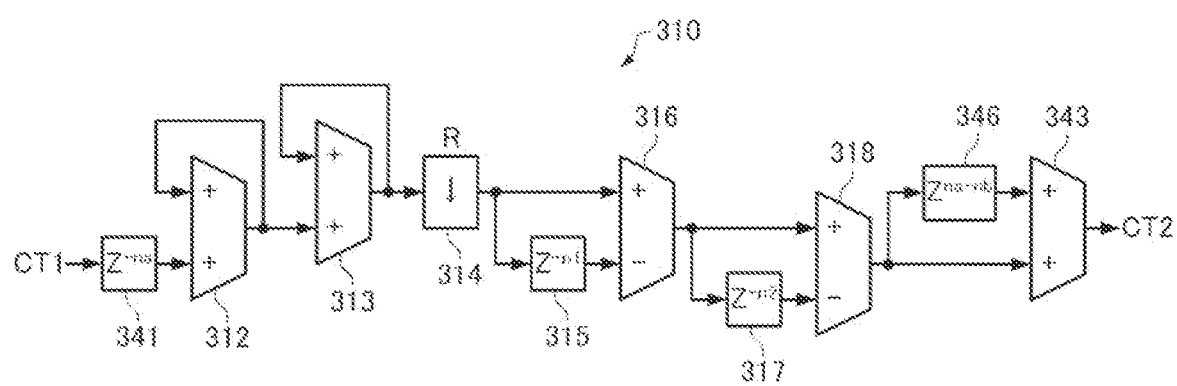
FIG. 25 is a diagram illustrating another configuration example of the first low-pass filter according to the second embodiment.

FIG. 25 is a diagram illustrating another configuration example of the first low-pass filter 310 for obtaining the fourth signal Lout(t) satisfying Equation (5). In FIG. 25, the same components as in FIG. 24 are designated by the same reference numerals.

In the example of FIG. 25, the first low-pass filter 310 includes the integrator 312, the integrator 313, the decimator 314, the delay element 315, the differentiator 316, the delay element 317, the differentiator 318, the delay element 341, the adder 343, and a delay element 346. Each part of the first low-pass filter 310 operates in synchronization with the measured signal SIN.

Since the operation of the delay element 341 is the same as that in FIG. 20, the description thereof will be omitted.

The integrator 312 outputs a count value obtained by integrating the count values output from the delay element 341 in synchronization with the measured signal SIN.

Since the operations of the integrator 313, the decimator 314, the delay element 315, the differentiator 316, the delay element 317, and the differentiator 318 are the same as those in FIG. 14, the description thereof will be omitted.

The delay element 346 outputs a count value obtained by delaying the count value output from the differentiator 318 in synchronization with the measured signal SIN. The number of taps of the delay element 346 is na−nb. For example, the delay element 346 is realized by a shift register in which na−nb registers are serially coupled.

The adder 343 outputs the count value CT2 obtained by adding the count value output from the delay element 344 and the count value output from the delay element 345. The count value CT2 output from the adder 343 corresponds to the third signal.

Figure 26:
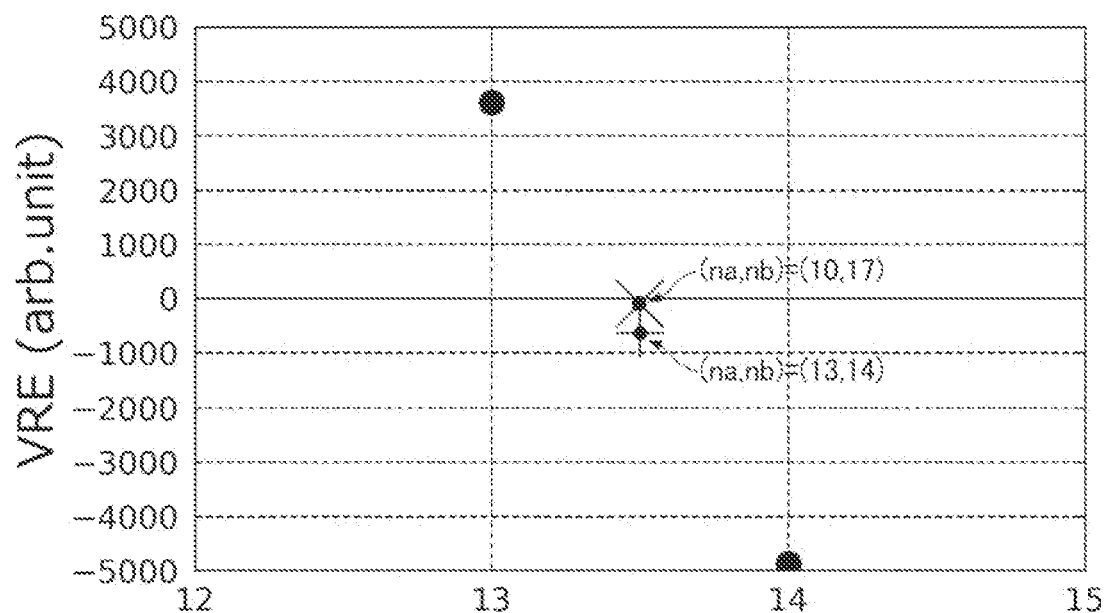
FIG. 26 is a diagram illustrating a method of correcting a vibration rectification error in the second embodiment.

For example, in the manufacturing step of the sensor module 1, the inspection device acquires the vibration rectification error of the measurement value while keeping the numbers of taps na and nb at the same value and sequentially changing the numbers of taps na and nb via the interface circuit 230 to find the relationship between the number of taps and the vibration rectification error. The inspection device selects the numbers of taps na and nb that reduce the vibration rectification error of the measurement value based on the relationship between the number of taps and the vibration rectification error, and writes the selected the numbers of taps na and nb to the non-volatile memory of the storage unit 220 via the interface circuit 230. For example, when the relationship illustrated in FIG. 18 is obtained, na=13 and nb=14 may be selected so that the two vibration rectification errors have different polarities and the absolute values thereof are minimized. In this case, the vibration rectification error included in the fourth signal Lout(t) is indicated by a + symbol in FIG. 26, which is a partially enlarged diagram of FIG. 18. Further, in order to bring the vibration rectification error included in the measurement value close to 0, for example, na=10 and nb=17 may be selected so that the two vibration rectification errors have different polarities and the absolute values thereof are substantially equal. In this case, the vibration rectification error included in the fourth signal Lout (t) is indicated by the symbol x in FIG. 26.

Since the flowchart illustrating an example of the procedure of the vibration rectification error correction method by the vibration rectification error correction device 2 in the second embodiment is the same as that of FIG. 23, the illustration and description thereof will be omitted.

According to the sensor module 1 of the second embodiment described above, the same effect as that of the sensor module 1 of the first embodiment is obtained.

Further, according to the sensor module 1 of the second embodiment, in the vibration rectification error correction device 2, the correction processing of the vibration rectification error is simplified and the circuit area of the first low-pass filter 310 is further reduced because the product of the fifth signal $Lout_{na}(t)$ and the real number a and the product of the sixth signal $Lout_{nb}(t)$ and the real number b are omitted by Equation (4) or Equation (5) in which the real number a and the real number b of Equation (2) or Equation (3) are 1.

3. Third Embodiment

Hereinafter, regarding a sensor module of a third embodiment, the same components as those of the first embodiment or the second embodiment are designated by the same reference numerals, the description overlapping with the first embodiment or the second embodiment is omitted or simplified, and the contents different from the first embodiment and the second embodiment will be mainly described.

Since the sensitivity of the physical quantity sensor 200 is strongly correlated with the cantilever resonance frequency, it is possible to check the abnormal sensitivity of the physical quantity sensor 200 by measuring the cantilever resonance frequency. For example, if the weight fixed to the cantilever is missing for some reason, the mass of the cantilever decreases and the cantilever resonance frequency is shifted to a high frequency. At the same time, the sensitivity of the physical quantity sensor 200 decreases, and the sensitivity of the physical quantity sensor 200 becomes abnormal. Further, when the cantilever is damaged by a strong impact or the like, the sensitivity of the physical quantity sensor 200 becomes abnormal and the cantilever resonance frequency is also shifted. Therefore, identifying the cantilever resonance frequency is one method for determining whether or not the sensitivity of the physical quantity sensor 200 is within the specifications. Generally, FFT can be used to identify the resonance frequency, but since the cantilever resonance frequency is higher than the signal bandwidth to be measured, and the resonance frequency component is attenuated by the first low-pass filter 310 and the second low-pass filter 330, some ingenuity is required n order to identify the resonance frequency with high accuracy. As described with reference to FIGS. 16A to 16D, the vibration rectification error changes at regular periods with respect to the change in the group delay amount of the first low-pass filter 310. This period is determined by the cantilever resonance frequency and the frequency of the physical quantity detection element 40, and when the cantilever resonance frequency or the frequency of the physical quantity detection element 40 changes, the fluctuation period of the vibration rectification error also changes. Therefore, by measuring the period of the change in the vibration rectification error with respect to the change in the group delay amount of the first low-pass filter 310, it is possible to obtain a determination index as to whether or not the sensitivity of the physical quantity sensor 200 is within the specifications.

Since the structure and functional configuration of the sensor module 1 of the third embodiment are the same as those of the first embodiment or the second embodiment, the illustration and description thereof will be omitted.

In the sensor module 1 of the third embodiment, the vibration rectification error correction device 2 has a normal operation mode for measuring the frequency ratio of the measured signal SIN and the reference signal CLK described above, and an inspection mode for checking the sensitivity of the physical quantity sensor 200. When the micro-control unit 210 receives a predetermined command from the processing device 3 via the interface circuit 230, the vibration rectification error correction device 2 is set to the normal operation mode or the inspection mode. For example, in the manufacturing step of the sensor module 1, the inspection device may set the vibration rectification error correction device 2 to the inspection mode, and the vibration rectification error correction device 2 may check the sensitivity of the physical quantity sensor 200. The inspection device may select non-defective products of the sensor module 1 based on the result of the sensitivity check. Alternatively, after the sensor module 1 is installed and before operation, the processing device 3 sets the vibration rectification error correction device 2 to the inspection mode, and the vibration rectification error correction device 2 checks the sensitivity of the physical quantity sensor 200. If there is no abnormality in the sensitivity of the physical quantity sensor 200 based on the result of the sensitivity check, the processing device 3 sets the vibration rectification error correction device 2 to the normal operation mode and operates the sensor module 1. In the normal operation mode, as in the first embodiment or the second embodiment, the measurement value in which the vibration rectification error is corrected can be obtained. Further, the processing device 3 may periodically set the vibration rectification error correction device 2 to the inspection mode, and the vibration rectification error correction device 2 may perform a sensitivity check. The normal operation mode is an example of a "first operation mode", and the inspection mode is an example of a "second operation mode".

In the inspection mode, the physical quantity sensor 200 is operated in a stable vibration environment, and the micro-control unit 210 functions as a control circuit to acquire the group delay amount dependence of the vibration rectification error based on the output signal of the physical quantity sensor 200 while changing the group delay amount of the first low-pass filter 310. Therefore, first, the micro-control unit 210 sets the cutoff frequency of the second low-pass filter 330 to be lower than that in the normal operation mode. Specifically, the micro-control unit 210 sets the cutoff frequency of the second low-pass filter 330 to, for example, several Hz so that the vibration rectification error included in the output value of the second low-pass filter 330 is emphasized. For example, the micro-control unit 210 may set the cutoff frequency to be lower than that in the normal operation mode by increasing the number of taps of the second low-pass filter 330.

Further, the micro-control unit 210 acquires the vibration rectification error of the measurement value while sequentially changing the numbers of taps na and nb with respect to the first low-pass filter 310 having the configuration illustrated in FIG. 20, 21, 24 or 25, and stores the number of taps and the vibration rectification error in the storage unit 220 in association with each other.

The processing device 3 reads out the correspondence information between the number of taps and the vibration rectification error from the storage unit 220 via the interface circuit 230 to calculate the period in which the vibration rectification error changes from a graph plotting the relationship between the number of taps and the vibration rectification error as illustrated in FIG. 17. Since this period is determined by the cantilever resonance frequency and the frequency of the physical quantity detection element 40, the processing device 3 can back-calculate the cantilever resonance frequency. The processing device 3 can determine whether or not the sensitivity of the physical quantity sensor 200 is within the specifications based on the calculated cantilever resonance frequency.

Alternatively, the micro-control unit 210 may read out the correspondence information between the number of taps and the vibration rectification error from the storage unit 220 to calculate the cantilever resonance frequency based on a graph plotting the relationship between the number of taps and the vibration rectification error and determine whether or not the sensitivity of the physical quantity sensor 200 is within the specifications.

FIG. 27 is a flowchart illustrating an example of the procedure of the vibration rectification error correction method by the vibration rectification error correction device 2 of the third embodiment.

As illustrated in FIG. 27, first, when the normal operation mode is set in step S110, in step S120, the vibration rectification error correction device 2 performs frequency delta-sigma modulation on the reference signal CLK by using the measured signal SIN to generate a frequency delta-sigma modulated signal.

Next, in step S130, the vibration rectification error correction device 2 performs the first filtering process on the signal based on the frequency delta-sigma modulated signal generated in the step S120 in synchronization with the measured signal SIN to generate the third signal based on the first signal having the first group delay amount based on the frequency delta-sigma modulated signal and the second signal having the second group delay amount that is different from the first group delay amount based on the frequency delta-sigma modulated signal.

Next, in step S140, the vibration rectification error correction device 2 performs the second filtering process on a signal based on the third signal generated in step S130 in synchronization with the reference signal CLK to generate the fourth signal Lout(t). Here, the first vibration rectification error $VRE_{na}$ included in the fifth signal $Lout_{na}(t)$ generated when the second filtering process is performed on the first signal and the second vibration rectification error included in the sixth signal $Lout_{nb}(t)$ generated when the second filtering process is performed on the second signal have different polarities.

In step S150, the vibration rectification error correction device 2 repeats steps S120, S130, and S140 until the measurement is completed. Steps S120, S130, and S140 are the same as steps S10, S20, and S30 in FIG. 23, respectively.

When the normal operation mode is not set in step S110 and the inspection mode is set in step S160, in step S170, the vibration rectification error correction device 2 sets the cutoff frequency of the second low-pass filter 330 to be lower than that in the normal operation mode.

Next, in step S180, the vibration rectification error correction device 2 sets the group delay amount of the first low-pass filter 310 to a predetermined value. Specifically, the vibration rectification error correction device 2 sets the numbers of taps na and nb to predetermined values.

Next, in step S190, the vibration rectification error correction device 2 acquires the output value of the second low-pass filter 330.

Next, in step S200, the vibration rectification error correction device 2 determines whether or not all the output values of the second low-pass filter 330 necessary for the sensitivity determination have been acquired.

When the acquisition of the required output value is not completed, the vibration rectification error correction device 2 changes the group delay amount of the first low-pass filter in step S210. Specifically, the vibration rectification error correction device 2 changes the number of taps na and/or nb.

When the acquisition of the required output value is completed, in step S220, the processing device 3 or the vibration rectification error correction device 2 calculates the period of change in the vibration rectification error by using a plurality of output values of the second low-pass filter 330 acquired in the step S190.

Next, in step S230, the processing device 3 or the vibration rectification error correction device 2 calculates the cantilever resonance frequency from the period of change in the vibration rectification error.

Next, in step S240, the processing device 3 or the vibration rectification error correction device 2 determines whether or not the sensitivity of the physical quantity sensor 200 is within the specifications based on the cantilever resonance frequency.

In step S250, the inspection mode of the vibration rectification error correction device 2 is terminated, and steps S110 and subsequent steps are repeated.

According to the sensor module 1 of the third embodiment described above, in the vibration rectification error correction device 2 as in the sensor module 1 of the first embodiment or the second embodiment, in the normal operation mode, the effect of reducing the vibration rectification error included in the fourth signal Lout(t) can be obtained.

On the other hand, in the inspection mode, by setting the cutoff frequency of the second low-pass filter 330 to be lower than that in the normal operation mode, the vibration rectification error included in the signal output from the second low-pass filter 330 is emphasized. Therefore, according to the sensor module 1 of the third embodiment, when the vibration rectification error correction device 2 acquires the signal output from the second low-pass filter 330 while changing the first group delay amount and the second group delay amount in the inspection mode, information indicating the relationship between the first group delay amount, the second group delay amount, and the vibration rectification error can be obtained. The vibration rectification error correction device 2, the inspection device or the processing device 3 calculates the cantilever resonance frequency of the physical quantity sensor 200 by using this information, and can determine whether or not the sensitivity of the physical quantity sensor 200 is within the specifications based on the cantilever resonance frequency.

4. Modification Example

The present disclosure is not limited to the present embodiment, and various modifications can be made within the scope of the gist of the present disclosure.

For example, in each of the above embodiments, the sensor module 1 includes three physical quantity sensors 200, but the number of the physical quantity sensors 200 included in the sensor module 1 may be one, two, or four or more.

In addition, in each of the above embodiments, as the physical quantity sensor 200, the sensor module 1 provided with an acceleration sensor is described as an example, but the sensor module 1 may include sensors such as an angular velocity sensor, a pressure sensor, and an optical sensor as the physical quantity sensor 200. In addition, the sensor module 1 may be provided with two or more types of physical quantity sensors among various physical quantity sensors such as an acceleration sensor, an angular velocity sensor, a pressure sensor, and an optical sensor.

In addition, in each of the above embodiments, an element configured by using quartz crystal as the physical quantity detection element 40 included in the physical quantity sensor 200 is given as an example, but the physical quantity detection element 40 may be configured by using a piezoelectric element other than quartz crystal, or may be a capacitance type MEMS element. MEMS is an abbreviation for micro electro mechanical systems.

Further, in each of the above embodiments, the first low-pass filter 310 is described as an example as the first filter, and the second low-pass filter 330 is described as an example as the second filter, but the first filter and the second filter may be a high-pass filter, a band-pass filter or a smoothing filter. Similarly, the first filtering process and the second filtering process may be a high-pass filtering process, a band-pass filtering process, or a smoothing filtering process, in addition to the low-pass filtering process.

The present disclosure is not limited to the present embodiment, and various modifications can be made within the scope of the gist of the present disclosure.

The above embodiments and modification examples are merely examples, and the present disclosure is not limited thereto. For example, it is possible to appropriately combine each embodiment and each modification example.

The present disclosure includes substantially the same configuration as the configuration described in the embodiments (for example, a configuration having the same function, method, and result, or a configuration having the same object and effect). In addition, the present disclosure includes a configuration in which a non-essential part of the configuration described in the embodiment is replaced. In addition, the present disclosure includes a configuration that exhibits the same operational effects as the configuration described in the embodiment or a configuration that can achieve the same object. In addition, the present disclosure includes a configuration in which a known technique is added to the configuration described in the embodiment.

The following contents are derived from the above-described embodiments and modification examples.

The vibration rectification error correction device according to one aspect includes a reference signal generation circuit that outputs a reference signal, a frequency delta-sigma modulation circuit that performs frequency delta-sigma modulation on the reference signal by using a measured signal to generate a frequency delta-sigma modulated signal, a first filter that operates in synchronization with the measured signal, and a second filter that operates in synchronization with the reference signal, in which the first filter generates a third signal based on a first signal having a first group delay amount based on the frequency delta-sigma modulated signal, and a second signal having a second group delay amount different from the first group delay amount based on the frequency delta-sigma modulated signal, the second filter receives a signal based on the third signal and outputs a fourth signal, and a first vibration rectification error included in a fifth signal output from the second filter when the first signal is input to the second filter and a second vibration rectification error included in a sixth signal output from the second filter when the second signal is input to the second filter have different polarities.

In this vibration rectification error correction device, since the first filter operates in synchronization with the measured signal, and the second filter operates in synchronization with the reference signal different from the measured signal, non-linearity occurs in the relationship between the frequency delta-sigma modulated signal, the fifth signal, and sixth signal. Due to the difference between the first group delay amount and the second group delay amount, the non-linearity of the relationship between the frequency delta-sigma modulated signal and the fifth signal and the non-linearity of relationship between the frequency delta-sigma modulated signal and the sixth signal are different to some degree. Therefore, according to this vibration rectification error correction device, because the correction resolution of the vibration rectification error is improved by using the first signal and the second signal in which the first group delay amount and the second group delay amount are set to appropriate values so that the first vibration rectification error included in the fifth signal and the second vibration rectification error included in the sixth signal have different polarities, the vibration rectification error included in the fourth signal can be effectively reduced.

In the vibration rectification error correction device according to one aspect, the fourth signal may be a signal obtained by adding a product of the fifth signal and a positive real number a and a product of the sixth signal and a positive real number b.

According to this vibration rectification error correction device, by omitting the scaling processing of the fourth signal, the correction processing of the vibration rectification error is simplified and the circuit area of the first filter is reduced without impairing the effect of reducing the vibration rectification error included in the fourth signal.

In the vibration rectification error correction device according to one aspect, the fourth signal may be a signal obtained by dividing a sum of a product of the fifth signal and a positive real number a and a product of the sixth signal and a positive real number b by a sum of the real number a and the real number b.

According to this vibration rectification error correction device, since the fourth signal having a reduced number of bits can be obtained by scaling, processing based on the fourth signal can be simplified.

In the vibration rectification error correction device according to one aspect, the real number a may be 1 and the real number b may be 1.

According to this vibration rectification error correction device, because the product of the fifth signal and the positive real number a and the product of the sixth signal and the positive real number b are omitted, the correction processing of vibration rectification error is simplified, and the circuit area of the first filter is reduced.

In the vibration rectification error correction device according to one aspect, one of the real number a and the real number b may be 1, and the other may be other than 1.

According to this vibration rectification error correction device, because the product of the fifth signal and the real number a or the product of the sixth signal and the real number b are omitted, the correction processing of vibration rectification error is simplified, and the circuit area of the first filter is reduced.

In the vibration rectification error correction device according to one aspect, the real number a and the real number b may be other than 1.

According to this vibration rectification error correction device, by setting the real number a and the real number b to appropriate values, the effect of reducing the vibration rectification error included in the fourth signal can be improved.

In the vibration rectification error correction device according to one aspect, a ratio of the real number a and the real number b may be a ratio of an absolute value of the second vibration rectification error and an absolute value of the first vibration rectification error.

According to this vibration rectification error correction device, the vibration rectification error included in the fourth signal can be made substantially 0.

The vibration rectification error correction device according to one aspect may include a storage unit that stores information for identifying the first group delay amount and the second group delay amount.

According to this vibration rectification error correction device, the vibration rectification error included in the fourth signal can be reduced without receiving the information of the first group delay amount and the second group delay amount from an external device.

The vibration rectification error correction device according to one aspect may include a first operation mode for measuring a frequency ratio of the measured signal and the reference signal, and a second operation mode in which a cutoff frequency of the second filter is lower than that in the first operation mode.

In this vibration rectification error correction device, the effect of reducing the vibration rectification error included in the fourth signal can be obtained in the first operation mode. On the other hand, in the second operation mode, since the cutoff frequency of the second filter is lower than that in the first operation mode, the vibration rectification error included in the signal output from the second filter is emphasized. Therefore, according to this vibration rectification error correction device, in the second operation mode, information indicating the relationship between the first group delay amount and the second group delay amount and the vibration rectification error can be obtained by acquiring the signal output from the second filter while changing the first group delay amount and the second group delay amount. The vibration rectification error correction device or an external device calculates the frequency of the structural resonance of the sensor that outputs a measured signal by using this information, for example, and can determine whether or not the sensitivity of the sensor is within the specifications based on the frequency of the structural resonance.

The sensor module according to one aspect includes the vibration rectification error correction device according to one aspect, a physical quantity sensor, in which the measured signal is a signal based on an output signal of the physical quantity sensor.

According to this sensor module, the measurement accuracy of physical quantities is improved because the vibration rectification error of the measurement value based on the output signal of the physical quantity sensor can be effectively reduced by providing a vibration rectification error correction device.

A vibration rectification error correction method according to one aspect includes performing frequency delta-sigma modulation on a reference signal by using a measured signal to generate a frequency delta-sigma modulated signal, performing a first filtering process on a signal based on the frequency delta-sigma modulated signal in synchronization with the measured signal to generate a third signal based on a first signal having a first group delay amount based on the frequency delta-sigma modulated signal, and a second signal having a second group delay amount different from the first group delay amount based on the frequency delta-sigma modulated signal, and performing a second filtering process on a signal based on the third signal in synchronization with the reference signal to generate a fourth signal, in which a first vibration rectification error included in a fifth signal generated when the second filtering process is performed on the first signal and a second vibration rectification error included in a sixth signal generated when the second filtering process is performed on the second signal have different polarities.

In this vibration rectification error correction method, since the first filtering process is performed in synchronization with the measured signal and the second filtering process is performed in synchronization with the reference signal different from the measured signal, non-linearity occurs in the relationship between the frequency delta-sigma modulated signal, the fifth signal, and the sixth signal. Due to the difference between the first group delay amount and the second group delay amount, the non-linearity of the relationship between the frequency delta-sigma modulated signal and the fifth signal and the non-linearity of relationship between the frequency delta-sigma modulated signal and the sixth signal are different to some degree. Therefore, according to this vibration rectification error correction method, because the correction resolution of the vibration rectification error is improved by using the first signal and the second signal in which the first group delay amount and the second group delay amount are set to appropriate values so that the first vibration rectification error included in the fifth signal and the second vibration rectification error included in the sixth signal have different polarities, the vibration rectification error can be effectively reduced.

What is claimed is:

1. A vibration rectification error correction device comprising:
    a reference signal generation circuit that outputs a reference signal;
    a frequency delta-sigma modulation circuit that performs frequency delta-sigma modulation on the reference signal by using a measured signal to generate a frequency delta-sigma modulated signal;
    a first filter that operates in synchronization with the measured signal; and
    a second filter that operates in synchronization with the reference signal, wherein
    the first filter generates a third signal based on a first signal having a first group delay amount based on the frequency delta-sigma modulated signal and a second signal having a second group delay amount different from the first group delay amount based on the frequency delta-sigma modulated signal,
    the second filter receives a signal based on the third signal and outputs a fourth signal, and
    a first vibration rectification error included in a fifth signal output from the second filter when the first signal is input to the second filter and a second vibration rectification error included in a sixth signal output from the second filter when the second signal is input to the second filter have different polarities.

2. The vibration rectification error correction device according to claim 1, wherein
    the fourth signal is a signal obtained by adding a product of the fifth signal and a positive real number a and a product of the sixth signal and a positive real number b.

3. The vibration rectification error correction device according to claim 2, wherein
    the real number a is 1, and the real number b is 1.

4. The vibration rectification error correction device according to claim 2, wherein
    one of the real number a and the real number b is 1 and the other is other than 1.

5. The vibration rectification error correction device according to claim 2, wherein
    the real number a and the real number b are other than 1.

6. The vibration rectification error correction device according to claim 2, wherein
    a ratio of the real number a and the real number b is a ratio of an absolute value of the second vibration rectification error and an absolute value of the first vibration rectification error.

7. The vibration rectification error correction device according to claim 1, wherein
    the fourth signal is a signal obtained by dividing a sum of a product of the fifth signal and a positive real number a and a product of the sixth signal and a positive real number b by a sum of the real number a and the real number b.

8. The vibration rectification error correction device according to claim 1, further comprising:
    a storage unit that stores information for identifying the first group delay amount and the second group delay amount.

9. The vibration rectification error correction device according to claim 1, wherein
    the device has a first operation mode for measuring a frequency ratio of the measured signal and the reference signal, and a second operation mode in which a cutoff frequency of the second filter is lower than that in the first operation mode.

10. A sensor module comprising:
    the vibration rectification error correction device according to claim 1; and
    a physical quantity sensor, wherein
    the measured signal is a signal based on an output signal of the physical quantity sensor.

11. A vibration rectification error correction method comprising:
    performing frequency delta-sigma modulation on a reference signal by using a measured signal to generate a frequency delta-sigma modulated signal;
    performing a first filtering process on a signal based on the frequency delta-sigma modulated signal in synchronization with the measured signal to generate a third signal based on a first signal having a first group delay amount based on the frequency delta-sigma modulated signal, and a second signal having a second group delay amount different from the first group delay amount based on the frequency delta-sigma modulated signal; and
    performing a second filtering process on a signal based on the third signal in synchronization with the reference signal to generate a fourth signal, wherein a first vibration rectification error included in a fifth signal generated when the second filtering process is performed on the first signal and a second vibration rectification error included in a sixth signal generated when the second filtering process is performed on the second signal have different polarities.

\* \* \* \* \*